US008044693B1

(12) United States Patent
Mannoorittathu et al.

(10) Patent No.: US 8,044,693 B1
(45) Date of Patent: Oct. 25, 2011

(54) OUTPUT VOLTAGE SLEW RATE CONTROL IN HARD DISK MOTOR DRIVE

(75) Inventors: Vishnu Mannoorittathu, Singapore (SG); Ying Tian Li, Sunglade (SG)

(73) Assignee: Marvell International Ltd., Hamilton (BE)

( * ) Notice: Subject to any disclaimer, the term of this patent is extended or adjusted under 35 U.S.C. 154(b) by 0 days.

(21) Appl. No.: 12/870,512

(22) Filed: Aug. 27, 2010

Related U.S. Application Data

(63) Continuation of application No. 12/020,447, filed on Jan. 25, 2008, now Pat. No. 7,786,778.

(60) Provisional application No. 60/979,200, filed on Oct. 11, 2007, provisional application No. 60/887,465, filed on Jan. 31, 2007.

(51) Int. Cl.
*H03K 5/12* (2006.01)
(52) U.S. Cl. ............... 327/170; 326/82; 326/83; 326/86
(58) Field of Classification Search .................. 327/170; 326/82, 83, 86
See application file for complete search history.

(56) References Cited

U.S. PATENT DOCUMENTS

| 5,877,647 | A  | * | 3/1999 | Vajapey et al. ............... 327/391 |
| 7,498,844 | B2 |   | 3/2009 | Rho |
| 2005/0105294 | A1 |   | 5/2005 | Cho et al. |

* cited by examiner

*Primary Examiner* — Lincoln Donovan
*Assistant Examiner* — John Poos

(57) ABSTRACT

A driver circuit includes a first transistor having a first node coupled to a high supply voltage and a second node coupled to an output node, wherein the first transistor passes the high supply voltage to the output node based on a first gate voltage on a gate of the first transistor. The driver circuit also includes a second transistor having a first node coupled to a low supply voltage and a second node coupled to the output node of the driver circuit, wherein the second transistor passes the low voltage to the output node based on a second gate voltage on a gate of the second transistor. The driver circuit further includes a logic block configured to control a slew rate of an output signal Vout at the output node by controlling a slew rate of the first gate voltage and controlling a slew rate of the second gate voltage.

20 Claims, 13 Drawing Sheets

OUTPUT VOLTAGE SLEW RATE CONTROL IN HARD DISK MOTOR DRIVE

CROSS-REFERENCE TO RELATED APPLICATION

The present application is a continuation of non-provisional application Ser. No. 12/020,447 filed Jan. 25, 2008 entitled, "OUTPUT VOLTAGE SLEW RATE CONTROL IN HARD DISK MOTOR DRIVE," now U.S. Pat. No. 7,786,778, issued Aug. 31, 2010 which claims priority to U.S. Provisional Patent Application No. 60/887,465, filed Jan. 31, 2007, and U.S. Provisional Patent Application No. 60/979,200, filed Oct. 11, 2007, the entire disclosure of which is hereby incorporated by reference in its entirety for all purposes except for those sections, if any, that are inconsistent with this specification.

FIELD

The present disclosure relates to electrical circuits, and more specifically to generating a pulse width modulated signal having a controlled slew rate.

BACKGROUND

Storing and retrieving data from a hard disk drive or other storage media is essential to modern electronics. A hard disk drive typically stores digitally encoded data on rapidly rotating platters having magnetic surfaces. Platters in a hard disk drive are usually rotated by a motor commonly referred to as a spindle motor.

One factor affecting the reliability of a hard disk drive is accurate control over the speed of rotation of platters (or the speed of a spindle motor). The speed of a spindle motor is typically controlled by a motor driver that provides power to the spindle motor using pulse-width modulation (PWM) techniques. As a result, an output of the motor driver (e.g., a pulse width modulated signal) switches between potentials of a positive power supply and a negative power supply (e.g., ground). This switching can cause electromagnetic interference (EMI) and noise that disrupts other sensitive circuits in the hard disk drive.

To reduce noise and EMI, the slew rate of the output of the motor driver needs to be controlled. However, controlling the slew rate with an inductor load present (such as an inductor load in a spindle motor) is difficult, especially during inductive recirculation when the output voltage quickly approaches the positive supply rail voltage. In addition, any slew rate controller needs to respond quickly to an input control signal to maintain the spindle motor at a constant speed, adding further difficulty to slew rate control.

SUMMARY

The foregoing situation is addressed by providing slew rate control of an output signal of a motor driver, wherein the slew rate control includes respective positive going and negative going pre-driver control circuits and pull-up/pull-down circuits to control the gate voltages of drive circuitry for the motor driver.

Thus, in one example aspect, a driver circuit includes a first transistor having a first node coupled to a high supply voltage and a second node coupled to an output node, wherein the first transistor passes the high supply voltage to the output node based on a first gate voltage on a gate of the first transistor. The driver circuit also includes a second transistor having a first node coupled to a low supply voltage and a second node coupled to the output node of the driver circuit, in which the second transistor passes the low voltage to the output node based on a second gate voltage on a gate of the second transistor. The driver circuit further includes a logic block configured to control a slew rate of an output signal Vout at the output node by controlling a slew rate of the first gate voltage during a first intermediate voltage period and controlling a slew rate of the second gate voltage during a second intermediate voltage period.

By virtue of the above arrangement, the output slew rate of the motor driver can be controlled such that noise and EMI are reduced without significant delay in response to an input signal. Moreover, the above arrangement reduces the occurrence of short circuits between large driver power transistors in the motor driver.

In another example aspect, a driving means includes a first transistor having a first node coupled to a high supply voltage and a second node coupled to an output node, wherein the first transistor passes the high supply voltage to the output node based on a first gate voltage on a gate of the first transistor. The driving means also includes a second transistor having a first node coupled to a low supply voltage and a second node coupled to the output node of the driving means, in which the second transistor passes the low voltage to the output node based on a second gate voltage on a gate of the second transistor. The driving means further includes a control means configured to control a slew rate of an output signal Vout at the output node by controlling a slew rate of the first gate voltage during a first intermediate voltage period and controlling a slew rate of the second gate voltage during a second intermediate voltage period.

A more complete understanding of the disclosure can be obtained by reference to the following detailed description and to the attached drawings.

DETAILED DESCRIPTION

Figure 1:
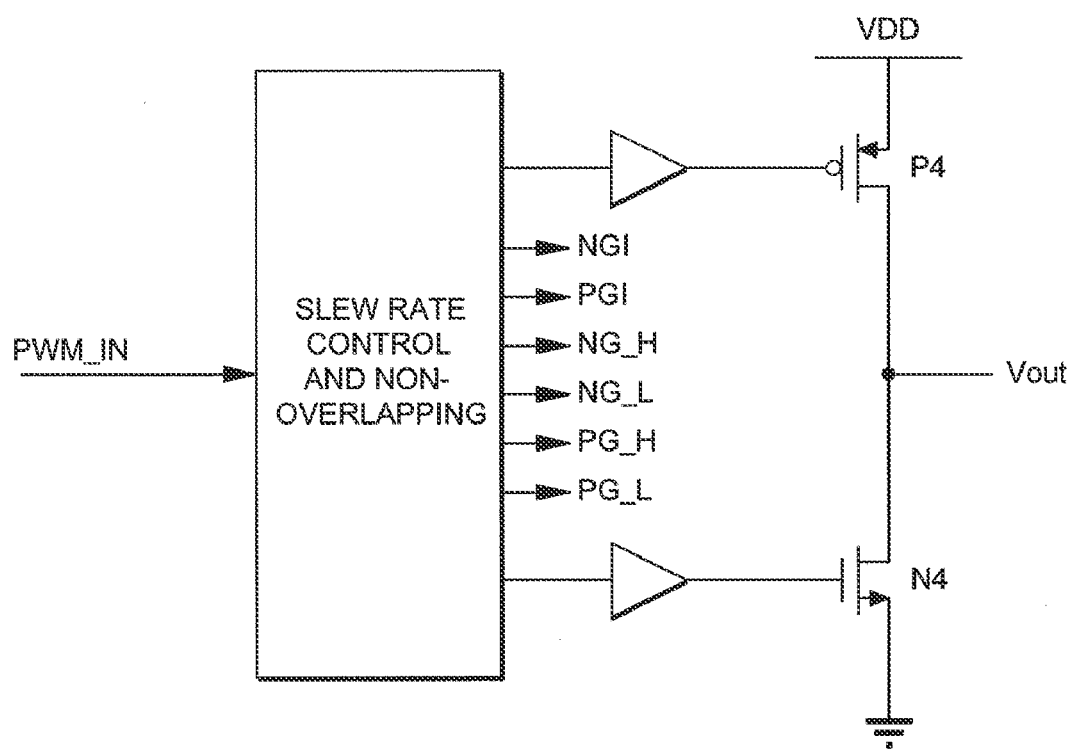
FIG. 1 is a schematic view of example elements of a motor driver circuit.

FIG. 1 is a schematic view of example elements of a motor driver circuit. The motor driver circuit can be implemented in a device (e.g., a hard disk drive) to drive a motor (e.g., a spindle motor) with a pulse-width modulated (PWM) signal having a controlled slew rate, as discussed in greater detail below.

As shown in FIG. 1, a pulse-width modulated input (PWM_IN) signal is input into a SLEW RATE CONTROL AND NON-OVERLAPPING logic block (referred to herein as "SRC_NO block") which produces intermediate signals NGI, PGI, NG_H, NG_L, PG_H and PG_L to drive PMOS transistor P4 and NMOS transistor N4. In this regard, the PG_H, PG_L, NG_H and NG_L logic signals are derived from PWM_IN, PGI & NGI after a constant fixed delay, so that once slewing process is over, PGATE & NGATE will be pulled hard to their respective levels.

In one implementation, PWM_IN is a pulse-width modulated input signal that is modified by the SRC_NO block to control the speed of a spindle motor in a hard disk drive. Pulse-width modulation control generally operates by switching power to a motor on and off very rapidly. In one example, DC voltage is converted to a square-wave signal (that, e.g., alternates between a positive supply voltage and ground) to give the motor a series of power "kicks". By adjusting a duty cycle of the square-wave signal, the average power to the motor can be varied, and therefore the speed of the motor can be varied.

However, as discussed above, the rapid switching of a motor driver output can cause electromagnetic interference (EMI) and noise in other sensitive circuits.

Thus, in the present example embodiment, the PWM_IN signal is an input into the SRC_NO block to produce a series of intermediate signals, shown in FIG. 1 as NGI, PGI, NG_H, NG_L, PG_H and PG_L. The intermediate signals are used to generate an output signal Vout having a controlled slew rate for driving a motor.

Figure 2:
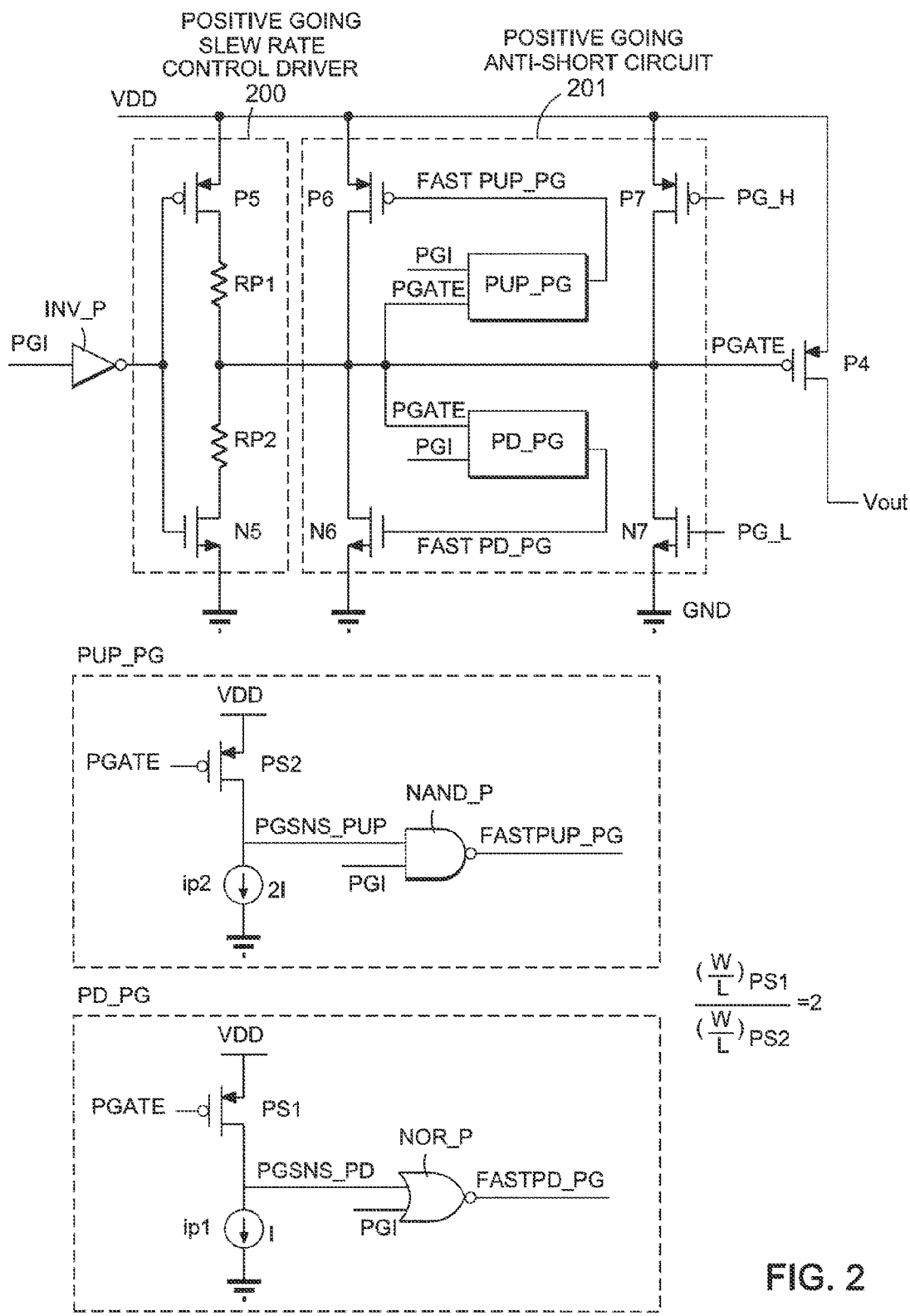
FIG. 2 is a schematic view of an example of positive going drive circuitry in the motor driver circuit of FIG. 1.
Figure 3:
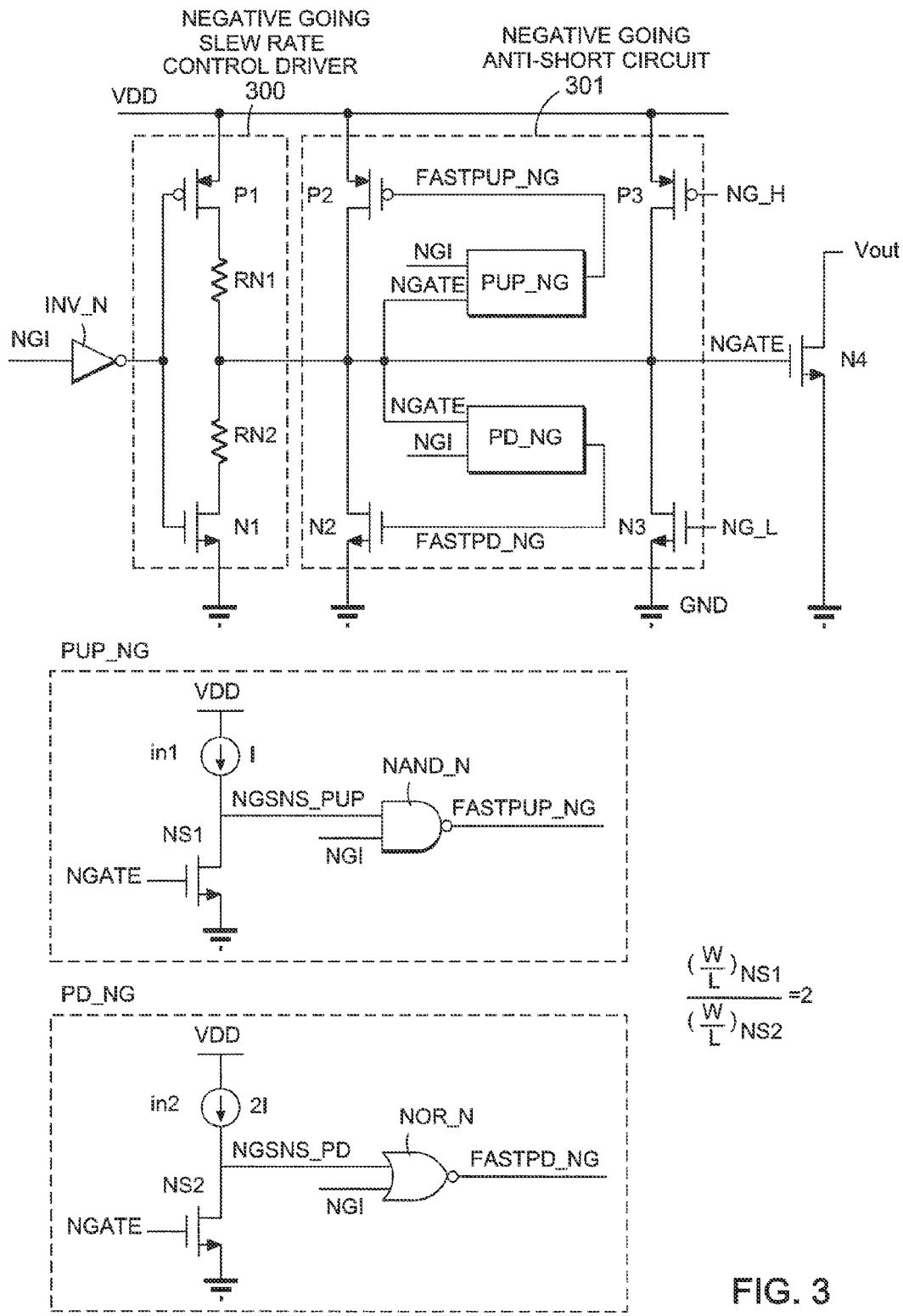
FIG. 3 is a schematic view of an example of negative going drive circuitry in the motor driver circuit of FIG. 1.

Signals PGI and NGI respectively drive the positive going drive circuitry shown in FIG. 2 and the negative going drive circuitry shown in FIG. 3. The positive going drive circuitry and the negative going drive circuitry respectively generate signals PGATE, NGATE to turn on and off PMOS power transistor P4 and NMOS power transistor N4 shown in FIG. 1. In one implementation, the PWM_IN signal is split in a non-overlapping way to produce signals PGI and NGI, which are complementary but nearly identical to the PWM_IN signal. Signals PGI and NGI respectively drive power transistors P4 and N4.

Signals PG_H and PG_L are used along with PGI to drive the positive going drive circuitry shown in FIG. 2, and signals NG_H and NG_L are used along with NGI to drive the negative going drive circuitry shown in FIG. 3.

For purposes of simplicity, FIG. 1 only depicts the intermediate signals produced by the SRC_NO block, without showing the positive going drive circuitry and negative going drive circuitry. The positive going drive circuitry is illustrated in detail in FIG. 2, and the negative going drive circuitry is illustrated in detail in FIG. 3.

As shown in FIG. 1, the motor driver circuit also includes PMOS power transistor P4 and NMOS power transistor N4. In this embodiment, PMOS power transistor P4 and NMOS power transistor N4 are physically large (e.g., has a larger W/L ratio) relative to the other transistors. The output voltage Vout (located at an output node of the motor driver circuit) between the power transistors P4, N4 represents a slew-rate controlled output signal that, in one implementation, is used to drive a motor (e.g., a spindle motor). In one implementation, the slew rate of the of the output signal Vout is controlled by controlling a slew rate of signals (i.e., PGATE and NGATE) that are input to the gates of the power transistors P4 and N4. The output voltage Vout is generated by transistors P4 & N4 together, since at any time only one of them will be on, pulling Vout to '1' or '0'.

The positive going drive circuitry and negative going drive circuitry will now be described with respect to FIGS. 2 and 3, respectively.

FIG. 2 is a schematic view of the positive going drive circuitry according to one example embodiment. The positive going drive circuitry combines with the negative going drive circuitry depicted in FIG. 3 to produce the slew-rate controlled output signal Vout.

As shown in FIG. 2, the positive going drive circuitry includes an inverter INV_P, PMOS transistors P5, P6 and P7, NMOS transistors N5, N6 and N7, subcircuits PUP_PG and PD_PG, and power transistor P4. Subcircuit PUP_PG includes PMOS transistor PS2, current source ip2 and NAND gate NAND_P, and subcircuit PD_PG includes PMOS transistor PS1, current source ip1, and NOR gate NOR_P.

In the positive going drive circuitry, fast pull-up and pull-down circuitry quickly drive PGATE, the gate signal for PMOS power transistor P4, to a level approaching Vdd or ground (depending on whether the input signal PWN_IN is a '0' or a '1'). Then, a positive going pre-drive control circuit (discussed in greater detail below) slows a slew rate of the PGATE signal so that the output signal Vout approaches Vdd or ground at a controlled slew rate. Finally, strong transistors P7 and N7 are used to drive and hold PGATE to Vdd or Ground. Each of circuits comprising the positive going drive circuitry will now be described in further detail.

According to one example embodiment, PMOS transistor P6, NMOS transistor N6, and subcircuits PUP_PG and PD_PG form a set of fast pull-up and pull-down circuitry. As mentioned, the fast pull-up and pull-down circuitry is used to quickly drive the PGATE signal to a voltage level near Vdd or ground (depending on whether the input PWM_IN is a '0' or '1'). Since the PGATE signal drives power transistor P4, the PGATE signal also drives the output signal Vout (in combination with power transistor N4).

In one implementation, the fast pull-up and pull-down circuitry reduce the delay of the output driver signal. Specifically, since PMOS power transistor P4 is a large transistor, there is a large gate to source parasitic capacitance associated with the PGATE signal. Thus, the fast pull-up and pull-down circuitry quickly drive the PGATE signal towards Vdd or ground, and help to avoid delays due to this parasitic capacitance. In one implementation, the parasitic capacitance of PMOS power transistor P4 is discharged using short duration current pulses. In one example aspect, FAST PUP_PG and FAST PD_PG are short duration pulses, and thus equivalent currents in P6 and N6 are the short duration current pulses.

In one implementation, the fast pull-up and pull-down circuitry function by using gate sensing circuits to sense the voltage of the PGATE signal, and to respond using controlled current sources. In this regard, transistors PS2 and current source Ip2 (in the fast pull-up circuitry) combine with transistor PS1 and current source Ip1 (in the fast pull-down circuitry) to function as the gate sensing circuit for PMOS power transistor P4. More specifically, since current sources ip1 and ip2 are generated and known, and because the state of the respective subcircuit outputs PGSNS_PUP and PGSNS_PD can be measured, an approximate value of the PGATE signal can be known and compensated for.

PMOS transistor P6 and subcircuit PUP-PG form the fast pull-up circuitry for the PGATE signal. The source of PMOS transistor P6 is connected to Vdd, while the drain of PMOS transistor P6 is connected to the PGATE signal. The gate of the PMOS transistor P6 is connected to the output signal of the PUP_PG subcircuit, shown in FIG. 2 as FASTPUP_PG.

In one implementation, the PUP_PG subcircuit receives PGATE and PGI as input signals, and produces the FASTPUP_PG signal as an output. As discussed above, the PUP-PG subcircuit includes PMOS transistor PS2, current source ip2, and NAND gate NAND_P. The gate of PMOS transistor PS2 is connected to the PGATE signal, the source of PMOS transistor PS2 is connected to Vdd, and the drain of PMOS transistor PS2 is connected to one input of the NAND gate, shown as signal PGSNS_PUP. The current source ip2 is also connected to the signal PGSNS_PUP. NAND gate NAND_P receives as inputs the PGSNS_PUP and the PGI signals and produces the NAND gate output FASTPUP_PG, which is used as the gate signal to PMOS transistor P6.

In one implementation, the fast pull-up circuitry uses the small PMOS transistor PS2 to sense a signal level of the power transistor PGATE signal, and uses the current source ip2 to scale down the current through power transistor P4. Then, using the FASTPUP_PG signal as an input to PMOS transistor P6, the PGATE signal can be quickly driven towards a high signal (e.g., a '1').

NMOS transistor N6 and subcircuit PD-PG form the fast pull-down circuitry for the PGATE signal. The source of NMOS transistor N6 is connected to Ground, while the drain of NMOS transistor N6 is connected to the PGATE signal. The gate of NMOS transistor N6 is connected to the output of the PD_PG subcircuit, shown as signal FASTPD_PG.

In one implementation, the PD_PG subcircuit receives PGATE and PGI as input signals, and produces the FASTPD_PG signal as an output. As shown in FIG. 2, the subcircuit PD-PG includes PMOS transistor PS1, current source ip1, and NOR gate NOR_P. The gate of PMOS transistor PS1 is connected to the PGATE signal, the source of PMOS transistor PS1 is connected to Vdd, and the drain of PMOS transistor PS1 is connected to one input of the NOR gate, shown as signal PGSNS_PD. The current source ip1 is also connected to the signal PGSNS_PD. NOR gate NOR_P receives as inputs the PGSNS_PD and PGI signals and produces the NOR gate output FASTPD_PG, which is used as the gate signal to NMOS transistor N6.

In one implementation, the fast pull-down circuitry uses the small PMOS transistor PS1 to sense a voltage level of the PGATE signal, and uses the current source ip1 to scale down the current through power transistor P4. Because current source ip1 is generated and known, and because the state of the output PGSNS_PD can be measured, an approximate value of the PGATE signal can be known.

Thus, as mentioned above, the fast pull up and pull down circuitry drive the PGATE signal quickly towards a high or a low (e.g., a '1' or '0') in order to avoid delays in the transitioning of the output signal Vout due to the parasitic capacitance of the PMOS power transistor P4. However, the high slew rate produced by the fast pull-up and pull-down circuitry cannot drive the entire transition, or the resultant fast switching will produce the same noise and EMI problems which the circuit is intended to reduce. Thus, the slew rate of the PGATE signal must be controlled to slow down as the output signal Vout approaches '0' or '1'. In one implementation, this feature is addressed by a positive going pre-driver control circuit, as shown in FIG. 2.

In FIG. 2, PMOS transistor P5, NMOS transistor N5, and resistors RP1 and RP2 form the positive going pre-driver control circuit according to one example embodiment. The positive going pre-driver control circuit is used to govern the slew rate of the PGATE signal, which drives PMOS power transistor P4. More specifically, once the PGATE signal has been quickly pulled up to a predetermined level, the positive going pre-driver control circuit slows the rate of transition (or slew rate) of the PGATE signal until the output signal Vout has reached a desired voltage level (representing, e.g., a '0' or '1').

In the positive going pre-driver control circuit shown in FIG. 2, the PGI signal is inverted and input to the gates of PMOS transistor P5 and NMOS transistor N5. The source of PMOS transistor P5 is connected to Vdd, and the drain of PMOS transistor P5 is connected to resistor RP1. The source of NMOS transistor N5 is connected to ground, and the drain of NMOS transistor N5 is connected to resistor RP2. Resistors RP1 and RP2 are connected in series between transistors P5 and N5, and to the gate of PMOS power transistor P4.

Figure 4:
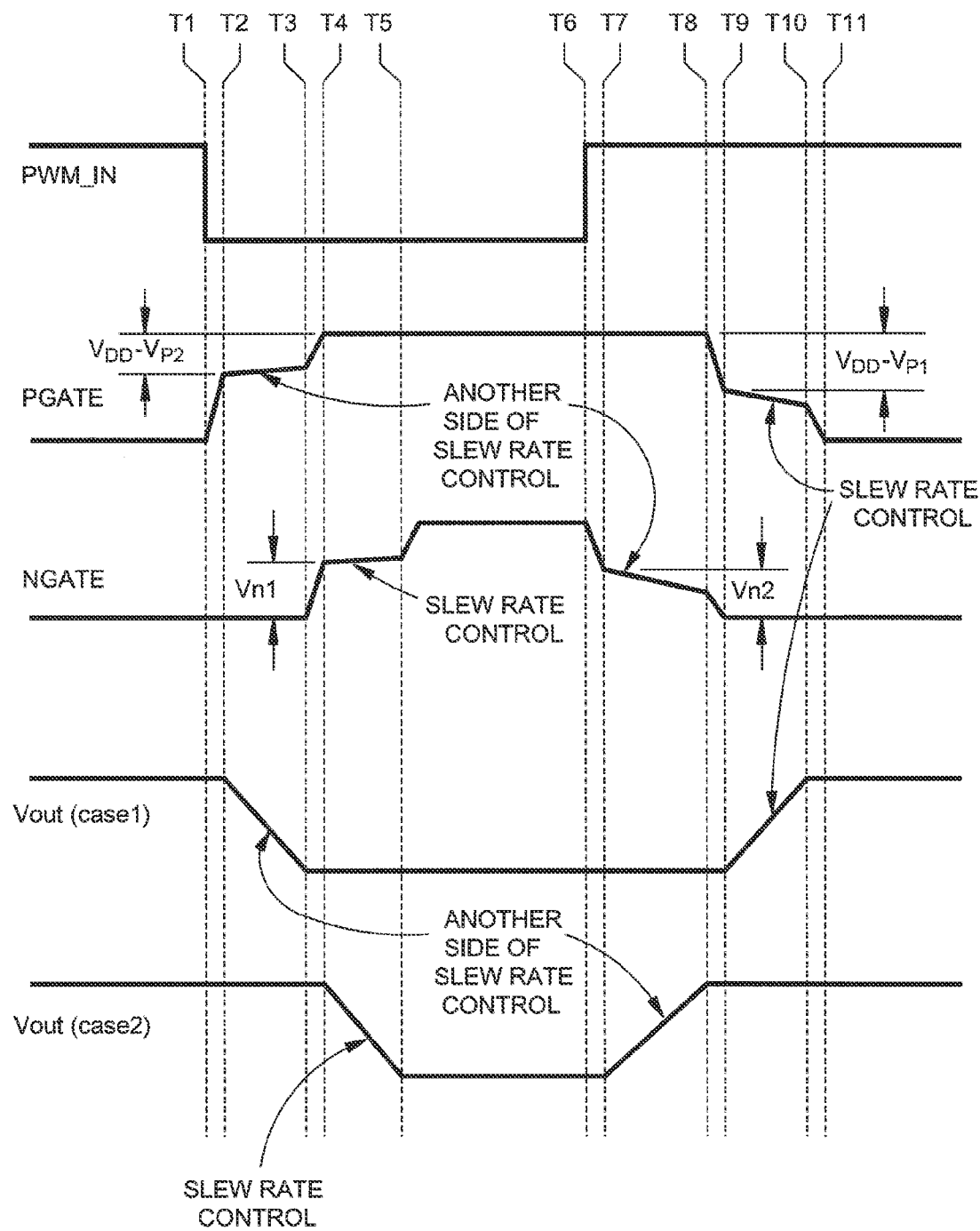
FIG. 4 is a timing diagram showing a progression of signals according to one example embodiment.

In one implementation, slew rate control of the PGATE signal is driven by different elements of the positive going pre-driver control circuit based on whether the PGATE signal is transitioning from '0' to '1', or from '1' to '0'. Each transition of the PGATE signal is shown in FIG. 4. The transition from '0' to '1' is labeled "another side of slew rate control", whereas the transition from '1' to '0' is labeled "slew rate control".

During "slew rate control", the slew rate of the PGATE signal is governed by the resistor value of RP1, the threshold voltage Pthp and on resistance of the PMOS transistor P5, and the gate parasitic capacitance Cp of PMOS power transistor P4.

Figure 9:
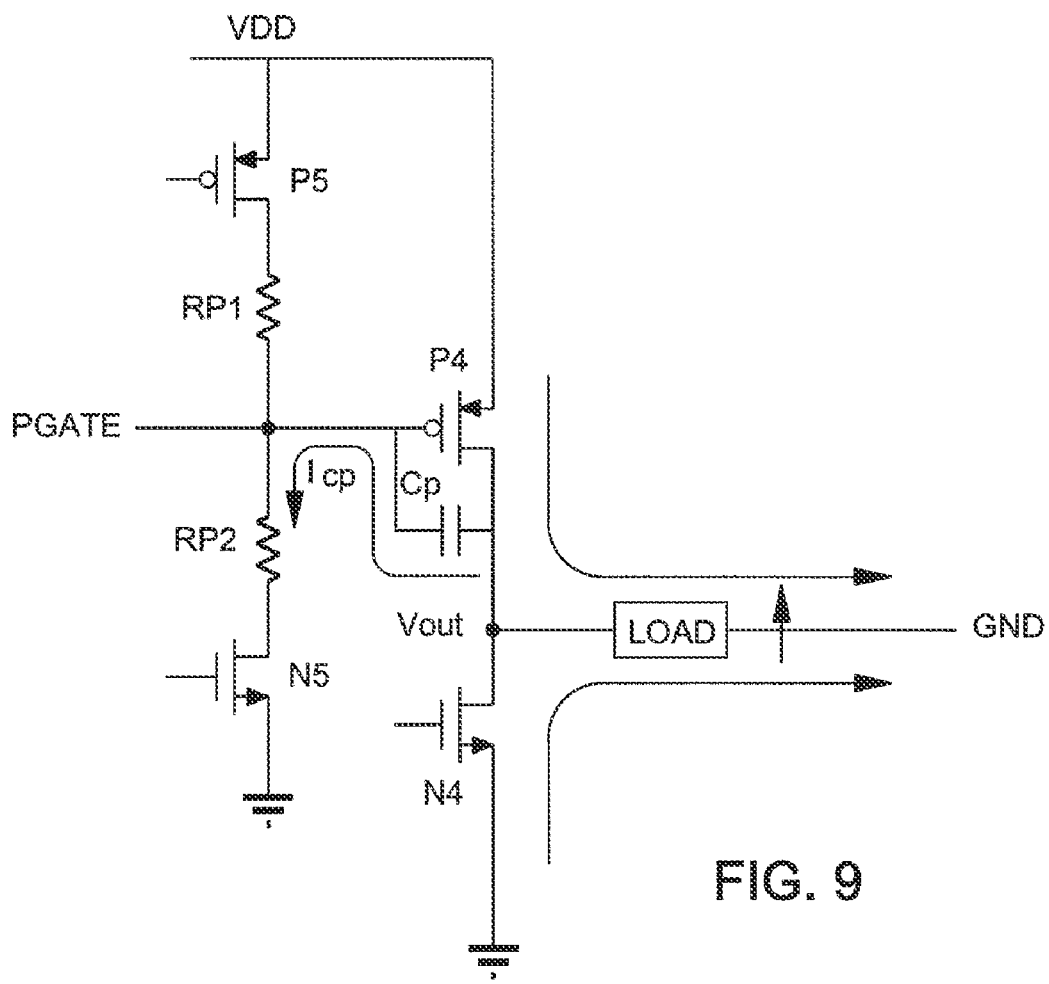
FIG. 9 is a schematic diagram of an example of another pre-driver control circuit.
Figure 10:
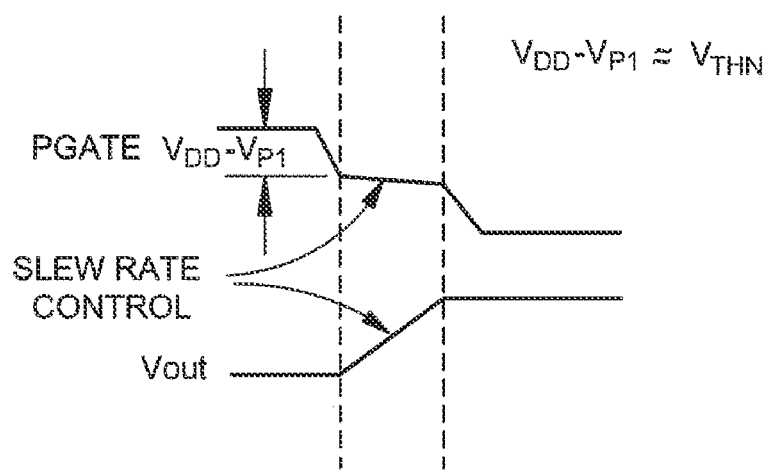
FIG. 10 is a timing diagram of another example of slew rate control.

More specifically, FIGS. 9 and 10 are reference diagrams for an explanation of how "slew rate control" for the output signal Vout relates to the PGATE signal.

In FIG. 9, the voltage Vdd, the resistance RP2, and the threshold voltage Vthp of the PMOS power transistor P4, and the gate capacitance Cp of PMOS power transistor P4 define the slew rate. The current through the gate capacitance Cp is defined as $(Vdd-Vthp)/RP2$, and since the slew rate is equal to the value of the output signal Vout over time, the slew rate equals $(Vdd-Vthp)/(RP2*Cp)$.

FIG. 10 depicts a closer view of the voltage values of the PGATE signal and the output signal Vout over the period of time during which "slew rate control" occurs.

Figure 13:
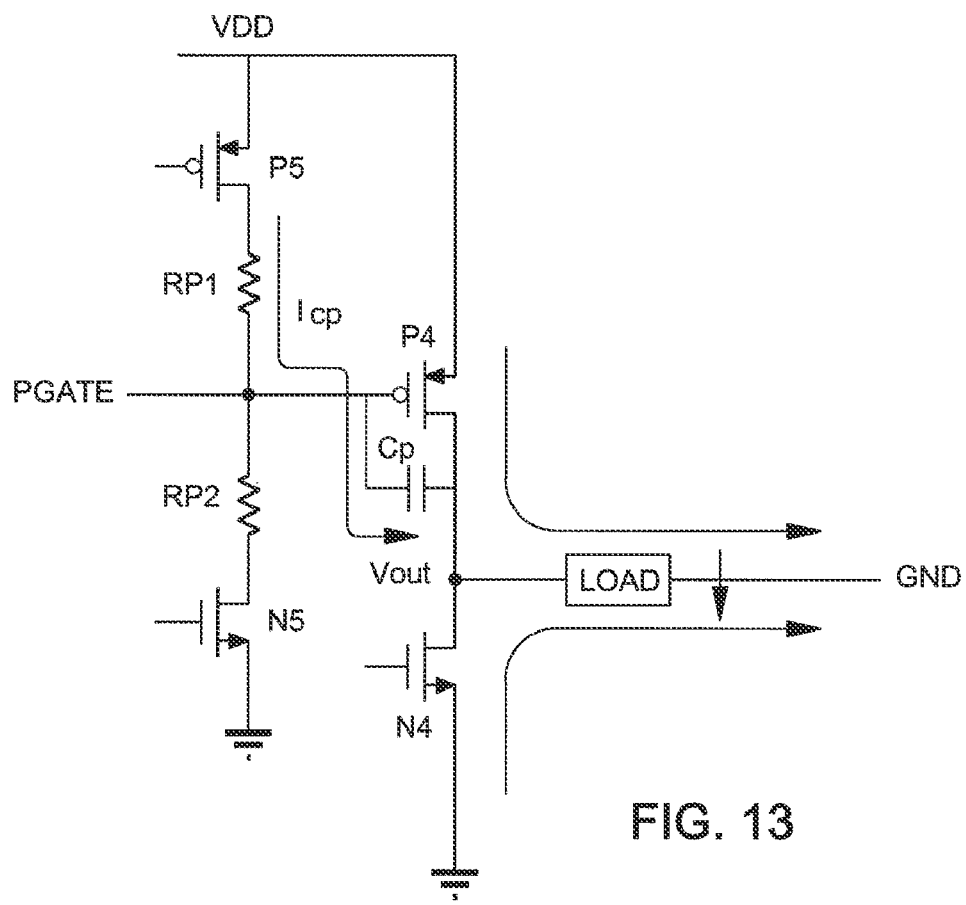
FIG. 13 is a schematic diagram of an example of a pre-driver control circuit.
Figure 14:
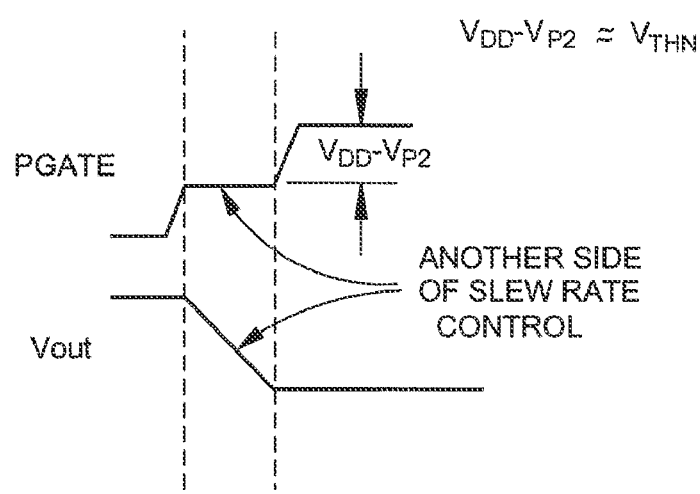
FIG. 14 is a timing diagram of another side of slew rate control.

FIGS. 13 and 14 are reference diagrams for an explanation of how "another side of slew rate control" for the output signal Vout relates to the PGATE signal. As shown in FIG. 13, "another side of slew rate control" for the PGATE signal is defined by the threshold value Vthp of PGATE power transistor P4, the gate capacitance Cp of PGATE power transistor P4, and the value of resistor RP1. Since Icp=Vthp/RP1, the slew rate at "another side of slew rate control" equals Vthp/(RP1*Cp).

FIG. 14 depicts a closer view of the voltage values of the PGATE signal and the output signal Vout over the period of time during which "another side of slew rate control" occurs.

Thus, slew rate control of the PGATE signal is driven by the elements of the positive going pre-driver control circuitry.

While the positive going pre-driver control circuit controls the slew rate of the PGATE signal, the slew rate control does not need to occur indefinitely. In one implementation, the slew rate control of the PGATE signal occurs only long enough to avoid the noise and EMI produced by a fast switching of output signal Vout. In addition, (in one implementation) the combination of the fast pull-up circuitry, the pull down circuitry, and the positive going pre-driver control circuit do not drive the PGATE signal all the way to Vdd or ground, only near Vdd or ground. Moreover, during the respective transitions of the PGATE and NGATE signals, PMOS power transistor P4 and NMOS transistor N4 should not both be on at the same time, since this would lead to a short-circuit.

Thus, after the slew rate control of the PGATE signal by the positive going pre-driver control circuit, strong transistors P7 and N7 are used to respectively pull the PGATE signal the remainder of the way to Vdd or ground, and hold the PGATE signal at Vdd or ground.

In one implementation, PMOS transistor P7 and NMOS transistor N7 are stronger (e.g., larger) than transistors P5 and N5 in the positive going pre-driver control circuit. Referring to FIG. 2, the source of PMOS transistor P7 is connected to Vdd, and the drain of PMOS transistor P7 is connected to the PGATE signal. The gate of PMOS transistor P7 is connected to the intermediate signal PG_H generated by the SRC_NO logic block shown in FIG. 1. The source of NMOS transistor N7 is connected to Ground, the drain of NMOS transistor N7 is connected to the PGATE signal, and the gate of NMOS transistor N7 is connected to the intermediate signal PG_L generated by the SRC_NO logic block shown in FIG. 1.

Thus, PMOS transistor P7 or NMOS transistor N7 pulls the PGATE signal up or down, and hold the PGATE signal at the desired level.

Accordingly, by virtue of the positive going drive circuitry, the PGATE signal can be driven high or low (e.g., to '0' or '1') at a controlled slew rate, while still reducing delays due to parasitic capacitance.

Turning to the NGATE signal, FIG. 3 is a schematic view of an example embodiment of the negative going drive circuitry.

As shown in FIG. 3, the negative going drive circuitry includes inverter INV_N, PMOS transistors P1, P2 and P3, NMOS transistors N1, N2 and N3, subcircuits PUP_NG and PD_NG, and power transistor N4. Subcircuit PUP_NG includes NMOS transistor NS1, current source in1 and NAND gate NAND_N, and subcircuit PD_NG includes PMOS transistor NS2, current source in2, and NOR gate NOR_N.

In one implementation, the negative going drive circuitry uses fast pull-up and pull-down circuitry to quickly drive the NGATE signal, the gate signal for power transistor N4, to a level approaching Vdd or ground (depending on whether the input signal PWN_IN is a '0' or a '1'). Then, a negative going pre-drive control circuit (discussed in greater detail below) slows the slew rate of the NGATE signal so that the output signal Vout approaches Vdd or ground at a controlled slew rate. Finally, strong transistors are used to drive and hold the NGATE signal to Vdd or ground.

According to one example embodiment, PMOS transistor P2, NMOS transistor N2, and subcircuits PUP_NG and PD_NG form the fast pull-up and pull-down circuitry according to one example embodiment. In one implementation, the fast pull-up and pull-down circuitry is used to quickly drive the NGATE signal to a threshold level approaching Vdd or ground (depending on whether the input PWM_IN is a '0' or '1'). Since the NGATE signal drives power transistor N4, the NGATE signal also affects the output signal Vout.

As is the case with the PGATE signal, the fast pull-up and pull-down circuitry (of the negative going drive circuitry) reduces the delay of the output driver signal. Specifically, like PMOS transistor P4, NMOS power transistor N4 is a large transistor, and there is a large gate to source parasitic capacitance associated with the NGATE signal. Thus, the fast pull-up or pull-down quickly drives the NGATE signal towards Vdd or ground, and helps to avoid delays due to the large parasitic capacitance. In one implementation, the parasitic capacitance of NMOS power transistor N4 is discharged using short duration current pulses. In one example aspect, FAST PUP_NG and FAST PD_NG are short duration pulses, and thus equivalent currents in P2 and N2 are the short duration current pulses.

In one implementation, the pull-up and pull-down circuitry (of the negative going drive circuitry) function by using gate sensing circuits to sense the voltage of the NGATE signal, and to respond using controlled current sources. In this regard, transistors NS1 and current sources In1 (in the fast pull-up circuitry) combine with transistor NS2 and current source In2 (in the fast pull-down circuitry) to function as the gate sensing circuits for NMOS power transistor N4. More specifically, since current source In1 and In2 are generated and known, and because the state of the respective subcircuits PUP_NG and PD_NG can be measured, an approximate value of the NGATE signal can be known and compensated for.

In one implementation, PMOS transistor P2 and subcircuit PUP-NG form the fast pull-up circuitry for the NGATE signal. The source of PMOS transistor P2 is connected to Vdd, while the drain of PMOS transistor P2 is connected to the NGATE signal. The gate of the PMOS transistor P2 is connected to the output of the PUP_NG subcircuit, shown in FIG. 3 as FASTPUP_NG.

In one implementation, the PUP_NG subcircuit receives NGATE and NGI as input signals, and produces the FASTPUP_NG signal as an output. As shown in FIG. 3, the subcircuit PUP-NG includes NMOS transistor NS1, current source in1, and NAND gate NAND_N. The gate of NMOS transistor NS1 is connected to the NGATE signal, the source of NMOS transistor NS1 is connected to ground, and the drain of NMOS transistor NS1 is connected to one input of the NAND gate NAND_N, shown as NGSNS_PUP. The current source in1 is also connected to the signal NGSNS_PUP. NAND gate NAND_N receives as inputs the NGSNS_PUP and the NGI signals and produces the NAND gate output FASTPUP_NG, which is used as the gate signal to PMOS transistor P2.

In one implementation, the fast pull-up circuitry uses a small NMOS transistor NS1 to sense a voltage level of the NGATE signal, and uses the current source in1 to scale down the current through power transistor N4. Then, using the FASTPUP_NG signal as an input to PMOS transistor P2, the NGATE signal can be quickly driven towards '0' or '1'.

In one implementation, the NMOS transistor N2 and subcircuit PD-NG form the fast pull-down circuitry for the NGATE signal. The source of NMOS transistor N2 is connected to ground, while the drain of NMOS transistor N2 is connected to the NGATE signal. The gate of the NMOS transistor N2 is connected to the output of the PD_NG subcircuit, shown in FIG. 3 as FASTPD_NG.

In one implementation, the PD_NG subcircuit receives NGATE and NGI as input signals, and produces the FASTPD_NG signal as an output. As shown in FIG. 3, the subcircuit PD-NG includes NMOS transistor NS2, current source in2, and NOR gate NOR_N. The gate of NMOS transistor NS2 is connected to the NGATE signal, the source of NMOS transistor NS2 is connected to ground, and the drain of NMOS transistor NS2 is connected to one input of the NOR gate, shown as NGSNS_PD. The current source in2 is also connected to the signal NGSNS_PD. NOR gate NOR_N receives as inputs the NGSNS_PD and NGI signals and produces the NOR gate output FASTPD_NG, which is used as the gate signal to NMOS transistor N2.

In one implementation, the pull-down circuitry uses the small NMOS transistor NS2 to sense a voltage level of the NGATE signal, and uses the current source in2 to scale down the current through power transistor N4. Because current source in2 is generated and known, and because the state of the output NGSNS_PD can be measured, an approximate value of the NGATE signal can be known.

Thus, the fast pull up and pull down circuitry (of the negative going drive circuitry) drive the PGATE signal quickly towards a high or a low (e.g., a '1' or '0') in order to avoid delays in the transitioning of the output signal Vout due to the parasitic capacitance of the NMOS power transistor N4. However, the high slew rate produced by the fast pull-up and pull-down circuitry cannot drive the entire transition, or the resultant fast switching will produce the same noise and EMI problems that the circuit is intended to reduce. Thus, the slew rate of the NGATE signal must be controlled to slow down as the output signal Vout approaches '0' or '1'. As in the positive going drive circuitry, this is accomplished in the negative going drive circuitry using a negative going pre-driver control circuit, as shown in FIG. 3.

In FIG. 3, PMOS transistor P1, NMOS transistor N1, and resistors RN1 and RN2 form the negative going pre-driver control circuit according to one example embodiment. The negative going pre-driver control circuit is used to govern the slew rate of the NGATE signal, which drives NMOS power transistor N4. More specifically, once the NGATE signal has been quickly pulled up or down to a predetermined level, the negative going pre-driver control circuit slows the rate of transition (or slew rate) of the NGATE signal until the output signal Vout has reached a desired voltage level (representing, e.g., a '0' or '1').

In one implementation, in the negative going pre-driver control circuit shown in FIG. 3, the NGI signal is inverted and input to the gates of PMOS transistor P1 and NMOS transistor N1. The source of PMOS transistor P1 is connected to Vdd, while the drain of PMOS transistor P1 is connected to resistor RN1. The source of NMOS transistor N1 is connected to ground, while the drain of NMOS transistor N1 is connected to resistor RP2. Resistors RN1 and RN2 are connected in series between P1 and N1, and to the gate of NMOS power transistor N4.

In one implementation, slew rate control of the NGATE signal is driven by different elements of the negative going pre-driver control circuit based on whether the NGATE signal is transitioning from '0' to '1', or from '1' to '0'. Each transition of the NGATE signal is shown in FIG. 4. In contrast to the labeling for the PGATE signal, the transition of the NGATE signal from '0' to '1' is labeled "slew rate control", and the transition of the NGATE signal from '1' to '0' is labeled "another side of slew rate control".

During "slew rate control", voltage Vdd, the resistor value of RN1, on resistance of P1, the threshold voltage Vthn of the NMOS power transistor N4, and the gate parasitic capacitance Cn of NMOS power transistor N4 govern the slew rate of NGATE.

Figure 7:
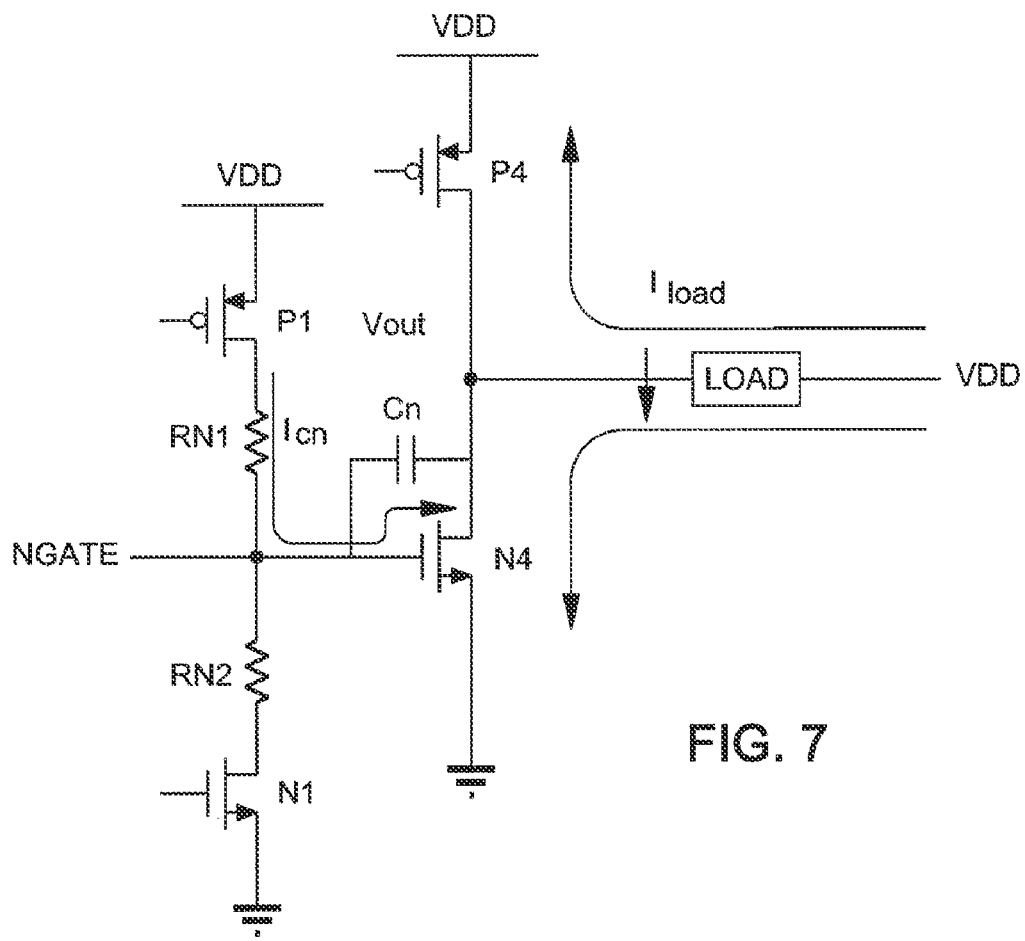
FIG. 7 is a schematic diagram of an example of a pre-driver control circuit.
Figure 8:
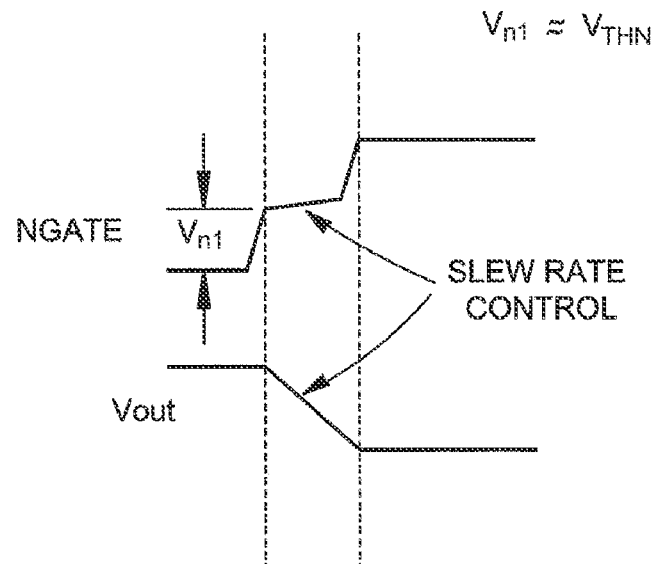
FIG. 8 is a timing diagram of an example of slew rate control.

More specifically, FIGS. 7 and 8 are reference diagrams for an explanation of how the slew rate control for the output signal Vout relates to the NGATE signal. In FIG. 7, the value of the resistor RN1, the gate capacitance Cn of the power transistor N4, and the threshold voltage Vthn of the power transistor N4 define the slew rate of the output voltage at N4. More specifically, the current through the capacitance can be defined by (Vdd−Vthn)/RN1, and since the slew rate is equal to the value of the output signal Vout over time, the slew rate equals (Vdd−Vthn)/(RN1*Cn).

FIG. 8 depicts a closer view of the value of the NGATE signal and the output signal Vout over the period of time during which "slew rate control" occurs.

Figure 11:
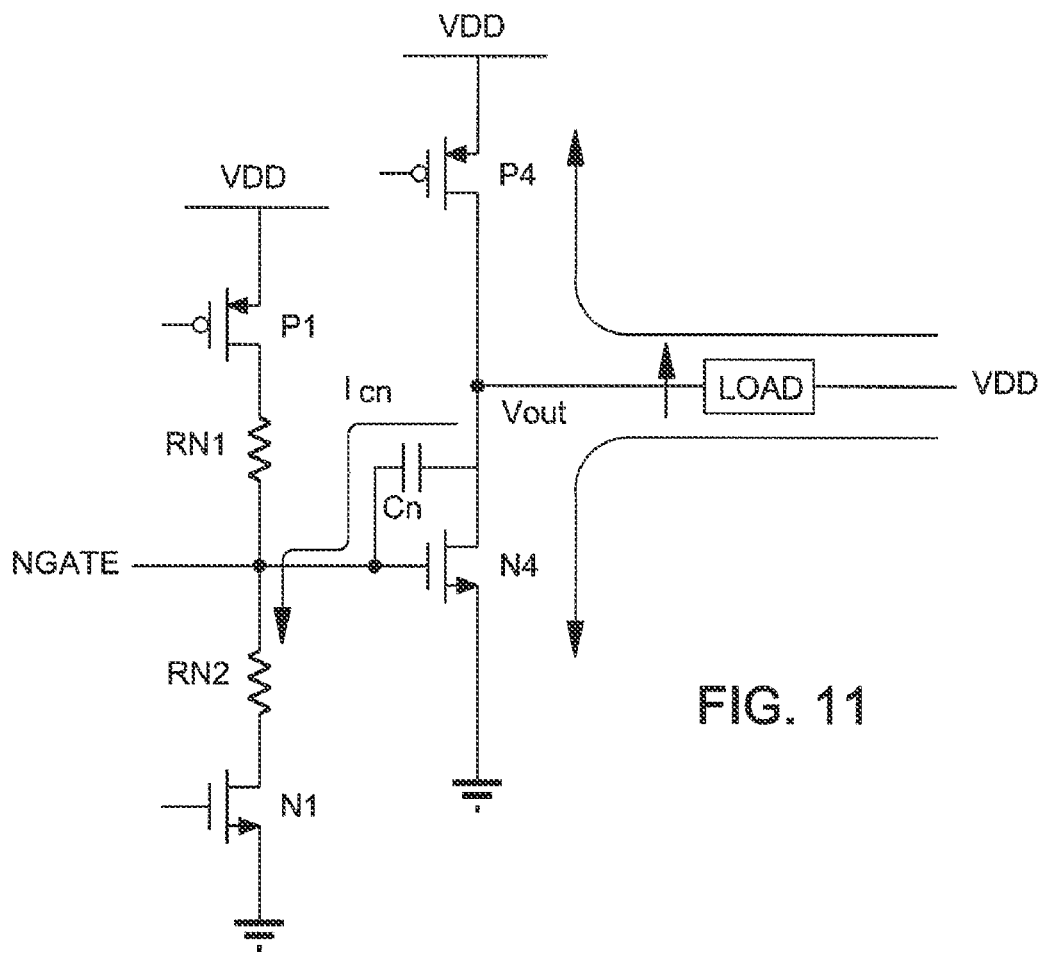
FIG. 11 is a schematic diagram of an example of a pre-driver control circuit.
Figure 12:
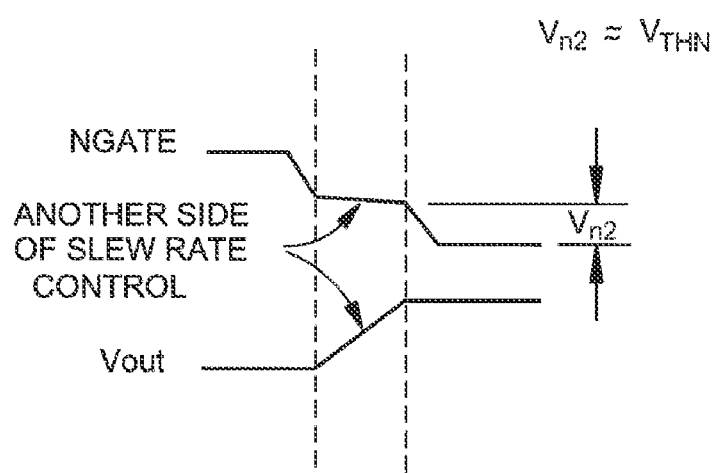
FIG. 12 is a timing diagram of another side of slew rate control.

FIGS. 11 and 12 are reference diagrams for an explanation of how "another side of slew rate control" for the output signal Vout relates to the NGATE signal.

As shown in FIG. 11, "another side of slew rate control" for the NGATE signal is defined by the threshold value Vthn of NGATE power transistor N4, the gate capacitance Cn of NGATE power transistor N4, and the value of the resistor RN2. More specifically, since Icn=Vthn/RN2, the slew rate at "another side of slew rate control" is defined by Vthn/(RN2*Cn).

FIG. 12 depicts a closer view of the value of the NGATE signal and the output signal Vout over the period of time during which "another side of slew rate control" occurs.

While the negative going pre-driver control circuit controls the slew rate of the NGATE signal, this slew rate control is not necessary indefinitely. In one implementation, the slew rate control of the NGATE signal occurs only long enough to avoid the noise and EMI produced by a fast switching of the output signal Vout. In addition, the combination of the fast pull-up and pull down circuitry and the negative going pre-driver control circuit do not drive the NGATE signal all the way to Vdd or ground, only near Vdd or ground. Moreover, during the respective transitions of the PGATE and NGATE signals, PMOS power transistor P4 and NMOS transistor N4 should not both be on at the same time, since this would lead to a short-circuit.

Thus, (in one implementation) after slew rate control of the NGATE signal by the negative going pre-driver control circuit, strong transistors P3 and N3 are used to respectively pull the NGATE signal the remainder of the way to Vdd or ground, and to hold the NGATE signal at Vdd or ground.

In one implementation, PMOS transistor P3 and NMOS transistor N3 are stronger (e.g., larger) than the transistors P1 and N1 in the negative going pre-driver control circuit.

As shown in FIG. 3, the source of PMOS transistor P3 is connected to Vdd, and the drain is connected to NGATE. The gate of PMOS transistor P3 is connected to the intermediate signal NG_H generated by the SRC_NO logic block shown in FIG. 1. The source of NMOS transistor N3 is connected to ground, the drain of NMOS transistor N3 is connected to NGATE, and the gate of NMOS transistor N3 is connected to the intermediate signal NG_L generated by the SRC_NO logic block shown in FIG. 1.

Thus, by virtue of the negative going drive circuitry, the NGATE signal can be driven high or low (e.g., to '0' or '1') at a controlled slew rate, while still avoiding delays.

A process of generating a slew-rate controlled output voltage Vout for driving a motor (e.g., a spindle motor) will now be described with respect to FIG. 4. FIG. 4 is a timing diagram showing a progression of signals according to one example embodiment. More specifically, FIG. 4 depicts the progression of PWM_IN, PGATE, NGATE, Vout (case 1) and Vout (case 2).

In this regard, FIG. 4 depicts two separate "cases" for Vout, case 1 and case 2. The overall output voltage is based on which of P4 or N4 is off or on, which is in turn based on the PGATE and NGATE signals. In particular, Vout is generated by transistors P4 & N4 together since at any time only one of them will be on, pulling Vout to '1' or '0'. Case 1 & Case 2 are thus two different scenarios depending on the load inductor current directions (or motor current direction inside the spindle motor coil) during inductive flyback.

For example, since PMOS power transistor P4 is connected to Vdd, if PMOS power transistor P4 is on while NMOS power transistor N4 is off, the output signal Vout will be driven to Vdd, since this voltage is coming through PMOS power transistor P4. On the other hand, if PMOS power transistor P4 is off while NMOS power transistor N4 is on, the output signal Vout will be driven to ground, since NMOS power transistor N4 is connected to ground.

Due to the inverters INV_P and INV_N which invert the PGI and NGI signals to the positive going drive circuitry and negative going drive circuitry, respectively, the signal coming into PGATE and NGATE is the opposite of PWM_IN. For example, as can be seen from the beginning of FIG. 4, since PWM_IN is fully on, both the PGATE and NGATE signals are '0'. However, it should be noted that the PGATE and NGATE signals are the driving signals, and not the output voltage, of power transistors N4 and P4.

In FIG. 4, PWM_IN depicts the value of the PWM_IN input signal over time, and in particular as the value of the PWM_IN input signal changes from '1' to '0', and then back to '1'. If a voltage of the output signal Vout were to match the exact transitions of the PWM_IN signal, the EMI and noise generated and coupling to other circuits on the chip may be unacceptably high. Thus, one example embodiment incorporates slew rate control of the output signal Vout, so as to reduce the occurrence of EMI and noise. As shown in FIG. 4, VN1 and VN2 are slew rate control threshold voltages for NMOS power transistor N4, and VP1 and VP2 are slew rate control threshold voltages for PMOS power transistor P4.

At the start of the timing diagram in FIG. 4, the main input PWM_IN is high. Thus, the PGATE and NGATE signals are both at low, and the output voltage Vout is high and follows the input. Because the PGATE and NGATE signals are at low, PMOS power transistor P4 is fully on, whereas NMOS power transistor N4 (FIG. 3) is off. Thus, the voltage level of the output signal Vout is Vdd.

Then, at time T1, the input PWM_IN changes from '1' to '0'. First, the fast pull-up circuitry for the PGATE signal, driven by PMOS transistor P6 and subcircuit PUP-PG, quickly pulls the voltage of the PGATE signal up from '0' to a voltage level that is (Vdd−VP2), as shown in FIG. 4. In one implementation, VP2 is approximately equal to Vdd−Vthp (the threshold voltage of PMOS power transistor P4).

Once the PGATE signal is pulled from 0 to (Vdd−VP2) at time T2, the fast transitioning of the PGATE signal ends, as PMOS transistor P6 is turned off. Then, PMOS transistor P5 and resistor RP1 will continue to pull the PGATE signal to Vdd, but at a much slower rate of transition, as shown in FIG. 4. This slew rate is labeled "another side of slew rate control" for the PGATE signal, and is defined by elements of the positive going pre-driver control circuit as described above.

By controlling the rate of transition (or the slew rate) of the PGATE signal, the slew rate of the output signal Vout is controlled. This can be seen in FIG. 4, in which Vout (Case 1) begins a controlled slew rate drop from Vdd to '0', following PWM_IN at a controlled slew rate. More specifically, since the PGATE signal is driven to '1', PMOS power transistor P4 is turned off. Meanwhile, since the NGATE signal is driven to '1', NMOS power transistor N4 is turned on. Thus, the output signal Vout is driven to ground, or '0'.

At time T3, the PGATE signal reaches Vdd−VP2, PMOS transistor P7 turns on to pull the PGATE signal to Vdd. In one implementation, this has two purposes—first, to increase the speed of the transition, and second, to avoid the short circuit current flowing from PMOS power transistor P4 to NMOS power transistor N4.

Once PMOS transistor P7 is turned on at T3, almost (or substantially) at the same time, the fast pull-up circuitry associated with the NGATE signal begins pulling up the NGATE signal, which can be seen in FIG. 4. The fast pull-up circuit pulls the NGATE signal to voltage VN1. In one implementation, VN1 is driven by parasitic capacitance of NMOS power transistor N4, the power supply Vdd, the transistor value RN1, and the threshold voltage Vthn of NMOS power transistor N4, and is described in further detail below. Pulling up the NGATE signal to voltage VN1 ensures that NMOS power transistor N4 is on, so that slew control for the NGATE signal can begin.

At time T4, the slew rate of the NGATE signal is controlled to be much slower than the pull-up slew rate. This slew rate is labeled "slew rate control", and is driven by the elements of the negative going pre-driver control circuit as described above.

Once the NGATE signal reaches VN1 (at time T5), strong transistor P3 will turn on to pull the NGATE signal to Vdd and hold the NGATE signal at Vdd.

Thus, the transitions of PGATE and NGATE signals from '0' to Vdd according to PWM_IN changing from '1' to '0' are finished. The PGATE and NGATE signals are both '1', and the output signal Vout is '0', following the state of PWM_IN as desired.

At time T6, there is another transition of PWM_IN, this time from '0' to '1'. This transition will be described more briefly, since the corresponding concepts have been described above with respect to the transition from '1' to '0'.

When PWM_IN changes from '0' to '1', the NGATE signal will get quickly pulled down by the fast pull-down circuitry (associated with the NGATE signal) to a value VN2, which (in one implementation) is near the threshold of NMOS power transistor N4 Vthn. This transition is labeled "Another side of slew rate control" in FIG. 4, and described above. Thus, the output signal Vout (case 2) begins to go high (or to '1') with slow slewing rate through inductive flyback in a controlled manner as transistor N4 begins to turn off. When this first transition from Vdd to VN2 is finished, the NGATE signal is pulled down by strong transistor N3 from VN2 to '0'. At the same time, PGATE starts coming down to the Vdd−Vp1 level, so PMOS power transistor P4 turns on as the output signal Vout begins to be driven to Vdd. Then, the slew rate control of the PGATE signal starts. First, the PGATE signal will be quickly pulled down by transistor N6 to a value (Vdd−VP1), which is near the threshold voltage of PGATE, Vthp. Once the PGATE signal reaches a value of (Vdd−VP1), the PGATE signal is pulled down by strong transistor N7 from (Vdd−VP1) to '0'. With the NMOS power transistor N4 off (due to the NGATE signal being at '0'), and the PMOS power transistor P4 on (due to the PGATE signal being at '0'), the output signal Vout is driven to Vdd, and the transition is finished.

Thus, by virtue of the above example embodiments, the slew rate of a pulse-width modulated signal (e.g., for driving a motor) can be controlled to a level that does not cause noise and EMI in other circuits without significant delay in response to an input signal. Moreover, the above arrangement reduces the occurrence of short circuits between power transistors in the circuit.

A more detailed example of how the gate sensing circuits determine the slew rate control threshold voltages for the NGATE and PGATE signals will now be described with respect to FIGS. 5 and 6, respectively.

Figure 5:
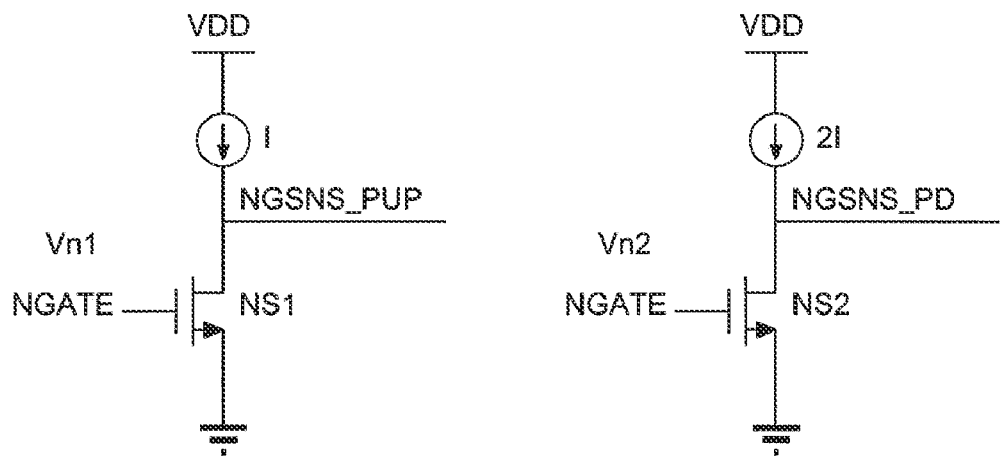
FIG. 5 is a schematic diagram of an example of a negative going gate sensing circuit for an NMOS power transistor.

FIG. 5 depicts the gate sensing circuits found in the subcircuits PUP_NG and PD_NG. As discussed above, transistors NS1, NS2 and current sources In1 and In2 are the gate sensing circuits for NMOS power transistor N4. In one implementation, these gate sensing circuits decide the slew rate control threshold voltages VN1 and VN2 for NGATE.

More specifically, in the gate sensing circuits, a sizing of the transistors NS1 and NS2 controls the voltage levels that the NGATE signal reaches. In addition, (in one implementation) VN1 is roughly the value of Vthn.

In the example shown in FIG. 5, transistors NS1 and NS2 are chosen such that the ratio of width to length of the respective gates $((W/L)_{NS1}/(W/L)_{NS2}$ is 2, and such that the ratio of biasing currents Id_NS1/Id_NS2 is ½. Thus, the ratio of the transconductances of transistors NS1 and NS2, i.e., gm_NS1/gm_NS2, is equal to the product of (W/L) and Id, which in this example is equal to 1.

From the circuit, we can determine Id_NS1=½ gm_NS1 (VN1−Vthn) and Id_NS2=½ gm_NS2 (VN2−Vthn). Therefore, Id_NS1/Id_NS2=(gm_NS1*(VN1−Vthn))/(gm_NS2*(VN2−Vthn)). Thus, (VN1−Vthn)/(VN2−Vthn)=(Id_NS1 gm_NS2)/(Id_NS2 gm_NS2). So, VN1−VN2=((Id_NS1*gm_NS2)/Id_NS2*gm_NS1)−1)*(VN2−Vthn). From this, we can determine VN2−VN1=½(VN2−Vthn). We can then say that (VN2−Vthn)=sqrt(2Id_NS2/$\mu_n$Cox $(W/L)_{NS2}$), wherein $\mu_n$ is the process related constant and Cox is the capacitance of the gate oxide layer of the transistor NS2 (since VN2 is being solved for). Thus, VN2=Vthn+sqrt (2Id_NS2/($\mu_n$Cox*$(W/L)_{NS2}$)). In addition, as noted above, VN1 is roughly the value of Vthn.

Figure 6:
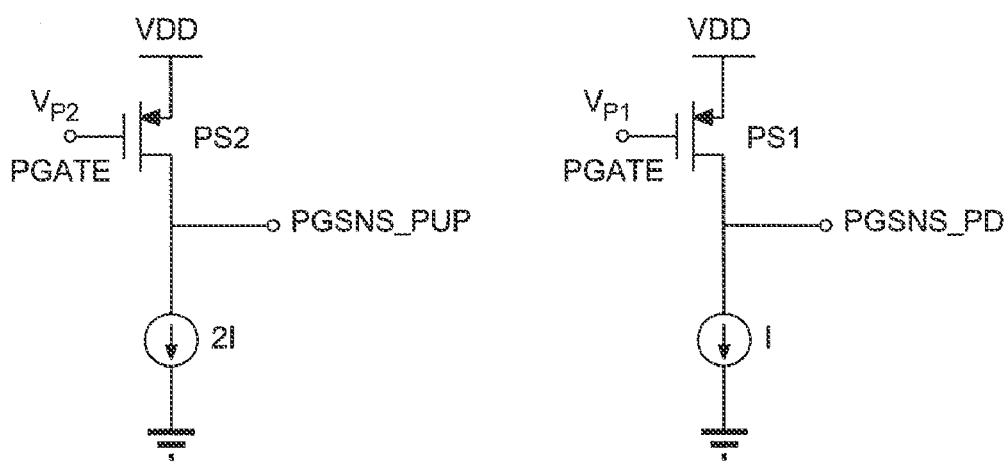
FIG. 6 is a schematic diagram of an example of a positive going gate sensing circuit for a PMOS power transistor.

FIG. 6 illustrates the gate sensing circuits found in the subcircuits PUP_PG and PD_PG. In particular, as mentioned above, transistors PS1, PS2 and current sources Ip1 and Ip2 are the gate sensing circuits for PMOS power transistor P4. In one implementation, these gate sensing circuits decide the slew rate control threshold voltages VP1 and VP2 for PGATE.

An example of how the gate sensing circuits decide the voltage levels VP1 and VP2 for PGATE in FIG. 4 will now be briefly described with respect to FIG. 6. In the gate sensing circuits, a designer can choose a sizing for the transistors PS1 and PS2 to control the voltage levels that the PGATE signal reaches. In addition, (in one implementation) VP1 is roughly the value of Vthp.

Voltage levels VP1 And VP2 are determined in a manner similar to that described above for VN1 and VN2, and therefore will not be described in great detail. In the example in FIG. 6, $(W/L)_{PS1}/(W/L)_{PS2}$=2, and Id_PS1/Id_PS2=½, similar to the NGATE calculations. Using a similar determination, it can be determined that VP2=Vth$_{PS2}$+sqrt(2Id_PS2/$\mu_p$Cox $(W/L)_{PS2}$), and that VP1=Vth$_{ps1}$+sqrt(2Id_PS1/($\mu_p$Cox*$(W/L)_{PS1}$)). Here, $\mu_p$ is a process constant and Cox is the capacitance of the gate oxide layer of the transistor PS1 (if solving for PS1) or of PS2 (if solving for PS2).

Figure 15A:
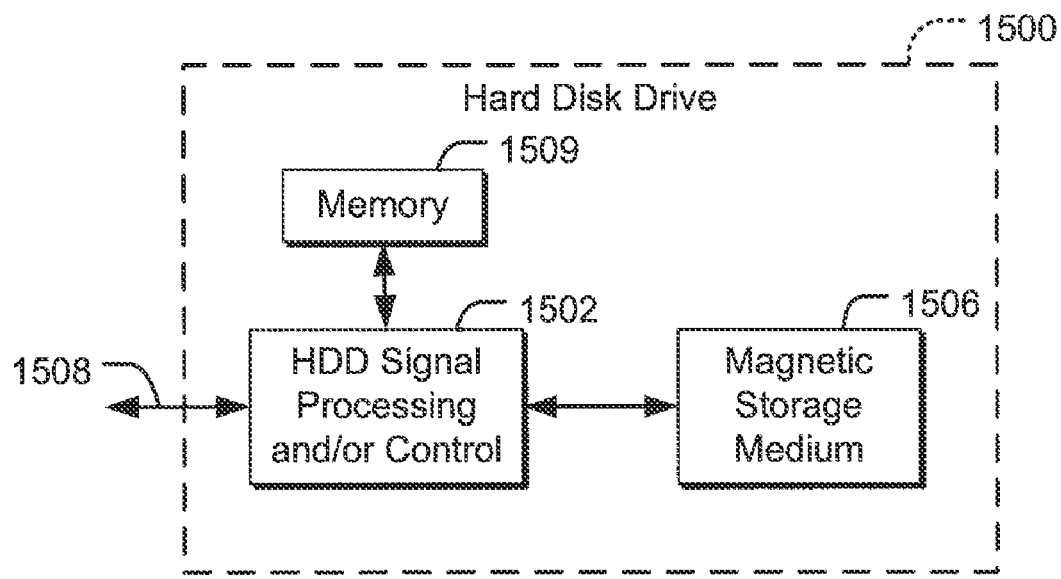
FIG. 15A is a block diagram showing an example embodiment of the invention in a hard disk drive (HDD).

Referring now to FIGS. 15A-15H, various exemplary implementations of the present invention are shown. Referring to FIG. 15A, the present invention may be embodied as a method of coordinating buffered data in a hard disk drive (HDD) 1500. The present invention may implement either or both signal processing and/or control circuits, which are generally identified in FIG. 15A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 15B:
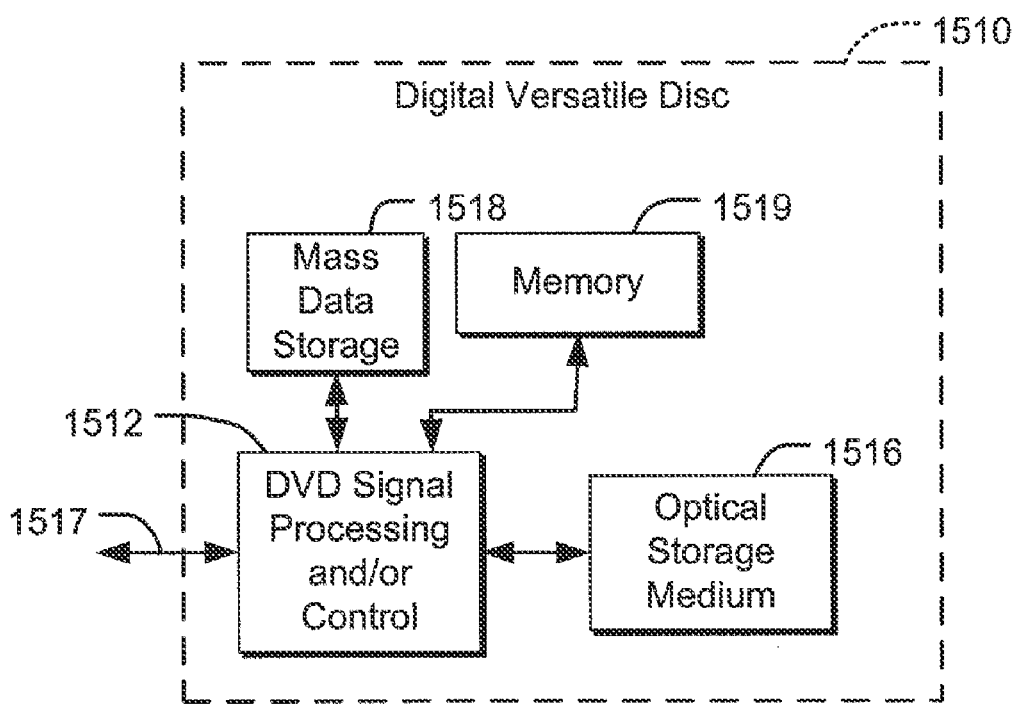
FIG. 15B is a block diagram of an example embodiment of the invention in a digital versatile disc (DVD) drive.

Referring now to FIG. 15B, the present invention may be embodied as a method of coordinating buffered data in a digital versatile disc (DVD) drive 1510. The present invention may implement either or both signal processing and/or control circuits, which are generally identified in FIG. 15B at 1512, and/or mass data storage 1518 of DVD drive 1510. Signal processing and/or control circuit 1512 and/or other circuits (not shown) in DVD drive 1510 may process data, perform coding and/or encryption, perform calculations, and/or format data that is read from and/or data written to an optical storage medium 1516. In some implementations, signal processing and/or control circuit 1512 and/or other circuits (not shown) in DVD drive 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD drive 1510 may communicate with mass data storage 1518 that stores data in a nonvolatile manner. Mass data storage 1518 may include a hard disk drive (HDD) such as that shown in FIG. 15A. The HDD may be a mini HDD that includes one or more platters having a diameter that is smaller than approximately 1.8". DVD drive 1510 may be connected to memory 1519, such as RAM, ROM, low latency nonvolatile memory such as flash memory, and/or other suitable electronic data storage.

Figure 15C:
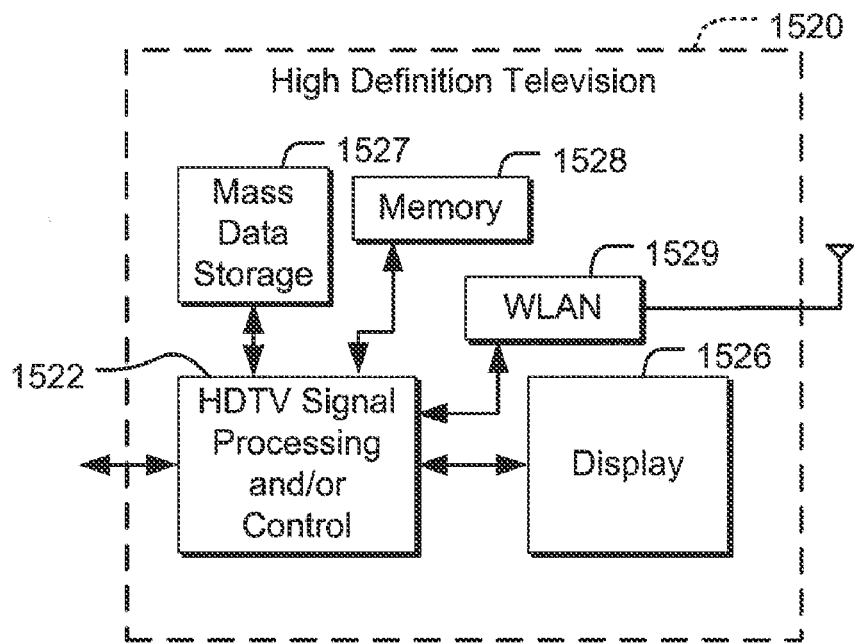
FIG. 15C is a block diagram of an example embodiment of the invention in a high definition television (HDTV).

Referring now to FIG. 15C, the present invention may be embodied as a method of coordinating buffered data in a high definition television (HDTV) 1520. The present invention may implement either or both signal processing and/or control circuits, which are generally identified in FIG. 15C at 1522, a WLAN network interface 1529 and/or mass data storage 1527 of the HDTV 1520. In one implementation, HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via WLAN network interface 1529.

Figure 15D:
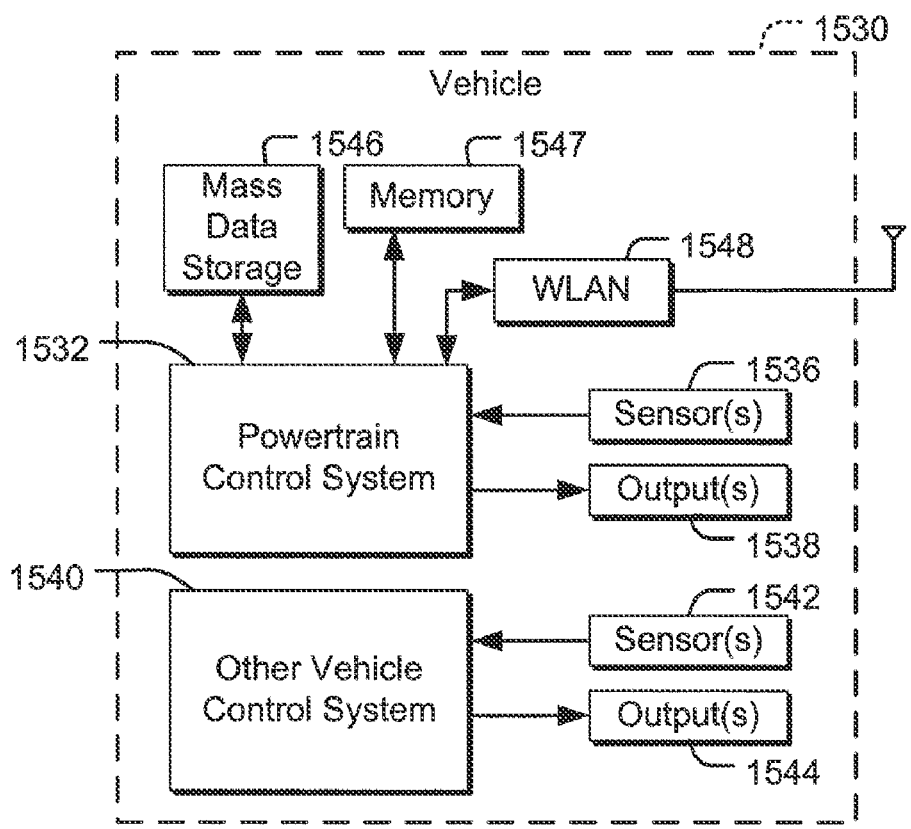
FIG. 15D is a block diagram of an example embodiment of the invention in a vehicle.

Referring now to FIG. 15D, the present invention may be embodied as a method of coordinating buffered data in a control system of a vehicle 1530, a WLAN network interface 1548 and/or mass data storage 1546 of the vehicle 1530. In some implementations, the present invention implements a powertrain control system 1532 that receives inputs from one or more sensors 1536 such as temperature sensors, pressure sensors, rotational sensors, airflow sensors and/or any other suitable sensors and/or that generates one or more output control signals 1538 such as engine operating parameters, transmission operating parameters, braking parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices for example hard disk drives and/or DVD drives. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via WLAN network interface 1548. The control system 1540 may also include mass data storage, memory and/or a WLAN network interface (all not shown).

Figure 15E:
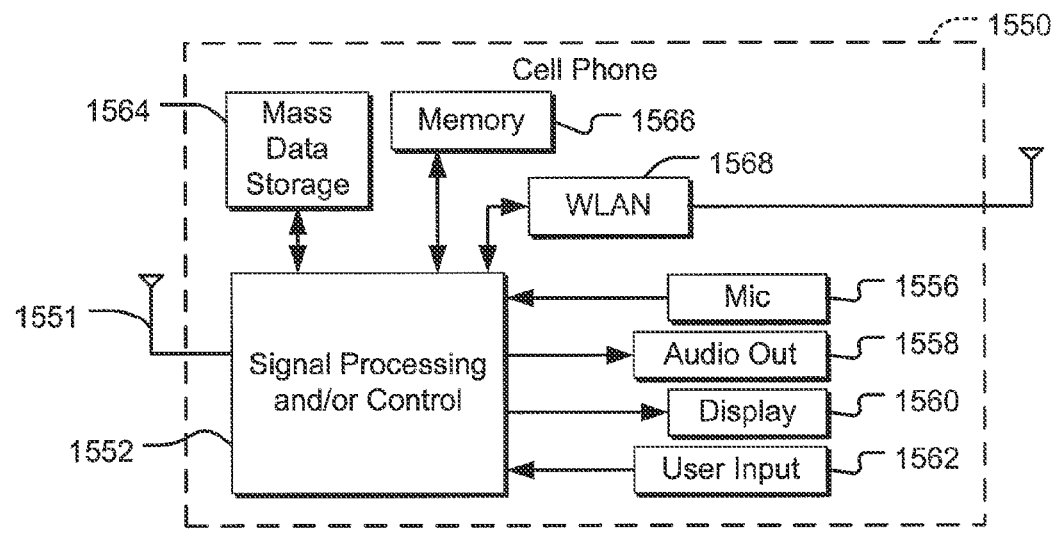
FIG. 15E is a block diagram of an example embodiment of the invention in a cellular or mobile phone.

Referring now to FIG. 15E, the present invention may be embodied as a method of coordinating buffered data in a cellular phone 1550 that may include a cellular antenna 1551. The present invention may implement either or both signal processing and/or control circuits, which are generally identified in FIG. 15E at 1552, a WLAN network interface 1568 and/or mass data storage 1564 of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices for example hard disk drives and/or DVD drives. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via WLAN network interface 1568.

Figure 15F:
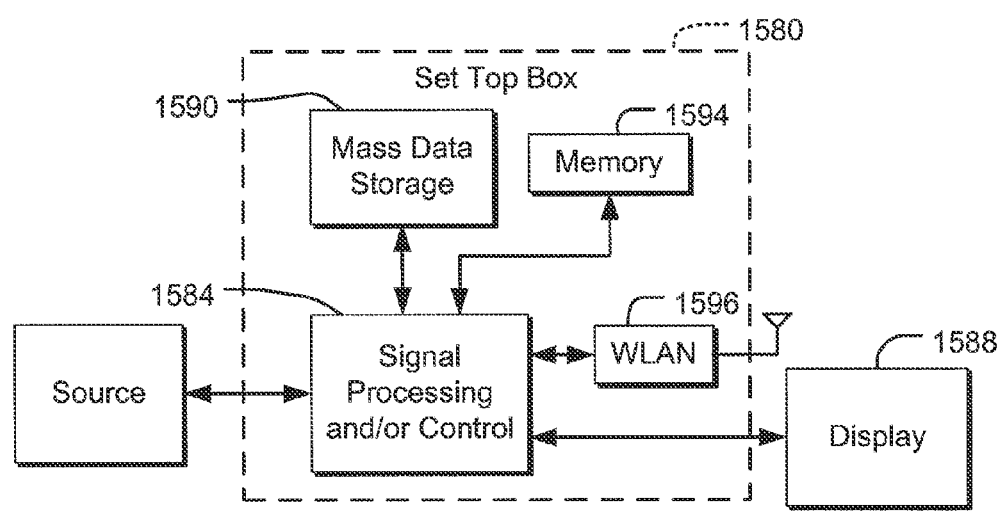
FIG. 15F is a block diagram of an example embodiment of the invention in a set-top box (STB).

Referring now to FIG. 15F, the present invention may be embodied as a method of coordinating buffered data in a set top box 1580. The present invention may implement either or both signal processing and/or control circuits, which are generally identified in FIG. 15F at 1584, a WLAN network interface 1596 and/or mass data storage 1590 of the set top box 1580. In one implementation, set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices for example hard disk drives and/or DVD drives. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via WLAN network interface 1596.

Figure 15G:
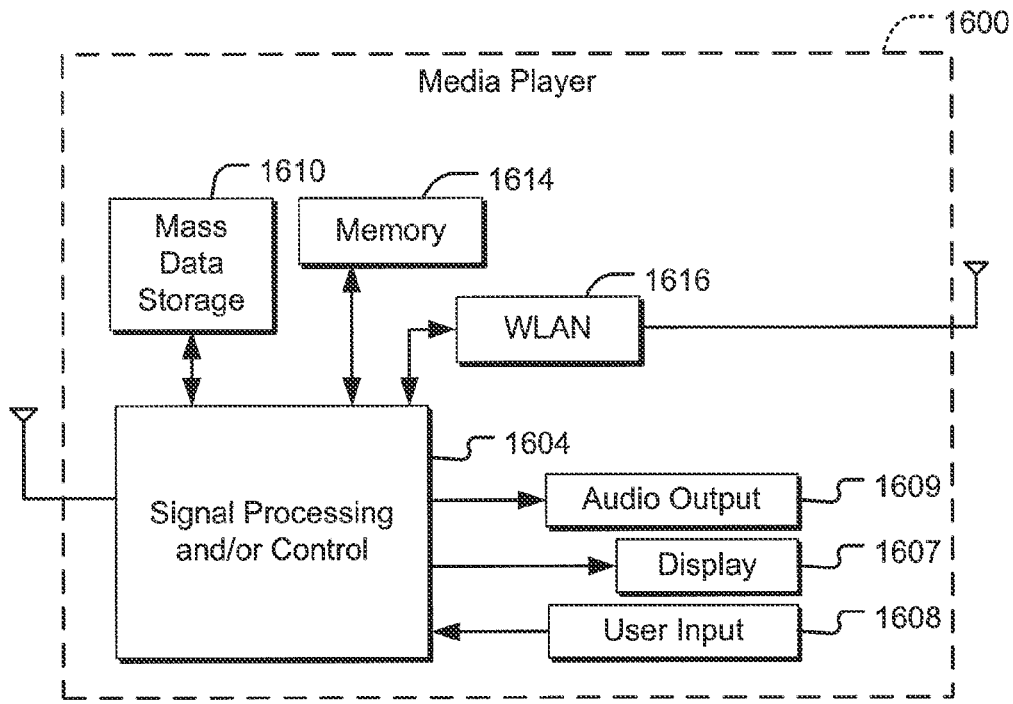
FIG. 15G is a block diagram of an example embodiment of the invention in a media player.

Referring now to FIG. 15G, the present invention may be embodied as a method of coordinating buffered data in a media player 1600. The present invention may implement either or both signal processing and/or control circuits, which are generally identified in FIG. 15G at 1604, a WLAN network interface 1616 and/or mass data storage 1610 of the media player 1600. In some implementations, media player 1600 includes a display 1607 and/or a user input 1608 such as a keypad, touchpad and the like. In some implementations, media player 1600 may employ a graphical user interface (GUI) that typically employs menus, drop down menus, icons and/or a point-and-click interface via display 1607 and/or user input 1608. Media player 1600 further includes an audio output 1609 such as a speaker and/or audio output jack. Signal processing and/or control circuits 1604 and/or other circuits (not shown) of media player 1600 may process data, perform coding and/or encryption, perform calculations, format data and/or perform any other media player function.

Media player 1600 may communicate with mass data storage 1610 that stores data such as compressed audio and/or video content in a nonvolatile manner. In some implementations, the compressed audio files include files that are compliant with MP3 format or other suitable compressed audio and/or video formats. The mass data storage 1610 may include optical and/or magnetic storage devices for example hard disk drives and/or DVD drives. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". Media player 1600 may be connected to memory 1614 such as RAM, ROM, low latency nonvolatile memory such as flash memory and/or other suitable electronic data storage. Media player 1600 also may support connections with a WLAN via WLAN network interface 1616. Still other implementations in addition to those described above are contemplated.

Figure 15H:
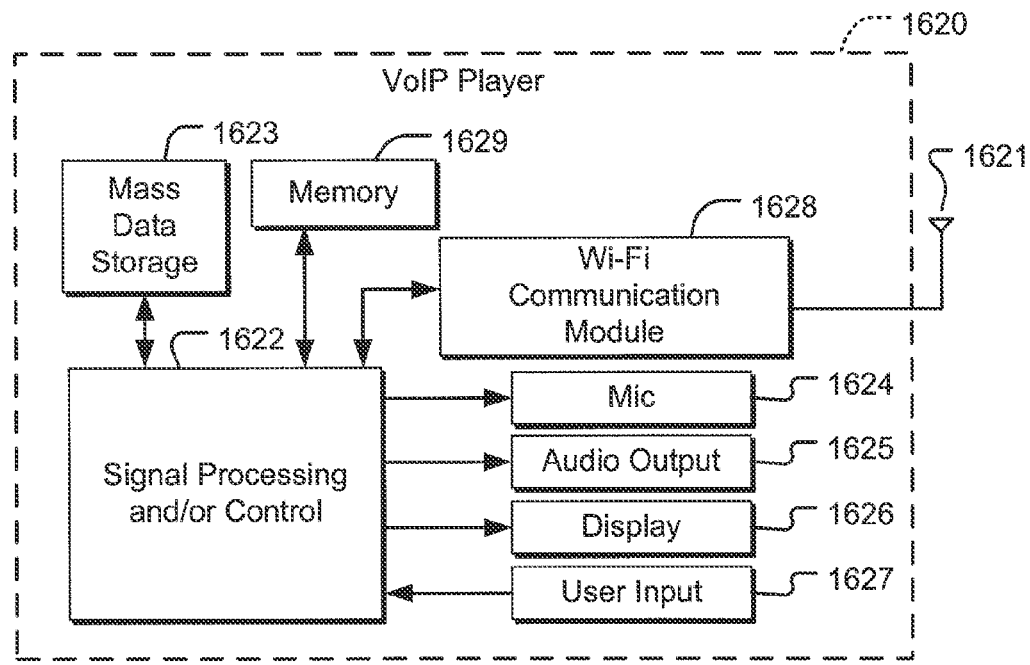
FIG. 15H is a block diagram of an example embodiment of the invention in a Voice-over Internet Protocol (VoIP) player.

Referring to FIG. 15H, the present invention may be embodied as a method of coordinating buffered data in a Voice over Internet Protocol (VoIP) player 1620 that may include an antenna 1621. The present invention may implement either or both signal processing and/or control circuits, which are generally identified in FIG. 15H at 1622, a wireless interface and/or mass data storage 1623 of the VoIP player 1620. In some implementations, VoIP player 1620 includes, in part, a microphone 1624, an audio output 1625 such as a speaker and/or audio output jack, a display monitor 1626, an input device 1627 such as a keypad, pointing device, voice actuation and/or other input devices, and a Wireless Fidelity (Wi-Fi) communication module 1628. Signal processing and/or control circuits 1622 and/or other circuits (not shown) in VoIP player 1620 may process data, perform coding and/or encryption, perform calculations, format data and/or perform other VoIP player functions.

VoIP player 1620 may communicate with mass data storage 1623 that stores data in a nonvolatile manner such as optical and/or magnetic storage devices, for example hard disk drives and/or DVD drives. At least one HDD may have the configuration shown in FIG. 15A and/or at least one DVD drive may have the configuration shown in FIG. 15B. The HDD may be a mini HDD that includes one or more platters having a diameter that is smaller than approximately 1.8". VoIP player 1620 may be connected to memory 1629, which may be a RAM, ROM, low latency nonvolatile memory such as flash memory and/or other suitable electronic data storage. In one implementation, VoIP player 1620 is configured to establish communications link with a VoIP network (not shown) via Wi-Fi communication module 1628.

Example aspects of the present disclosure have been described above with respect to particular illustrative example embodiments. It is understood that the disclosure is not limited to the above-described example embodiments and that various changes and modifications may be made by those skilled in the relevant art without departing from the spirit and scope of the disclosure.

What is claimed is:

1. A driver circuit configured to generate an output signal Vout having a controlled slew rate, the output signal Vout being generated at an output node of the driver circuit, the driver circuit comprising:
   a first transistor having (i) a first node coupled to a high supply voltage and (ii) a second node coupled to the output node of the driver circuit, the first transistor being configured to pass the high supply voltage to the output node based on a first gate voltage on a gate of the first transistor;
   a second transistor having (i) a first node coupled to a low supply voltage and (ii) a second node coupled to the output node of the driver circuit, the second transistor being configured to pass the low voltage to the output node based on a second gate voltage on a gate of the second transistor; and
   a logic block comprising
      a first fast pull-up logic circuitry configured to pull up the first gate voltage from the low supply voltage to a first intermediate voltage between the low supply voltage and the high supply voltage, and
      a first pull-up pre-driver control circuit configured to pull up the first gate voltage from the first intermediate voltage to the high supply voltage,
   wherein the logic block is configured to control the slew rate of the output signal Vout by (i) controlling a slew rate of the first gate voltage on the gate of the first transistor, and (ii) controlling a slew rate of the second gate voltage on the gate of the second transistor.

2. The driver circuit of claim 1, wherein the logic block is further configured to receive a single pulse-width modulated signal as an input, and wherein the logic block is configured to generate each of the first gate voltage and the second gate voltage based on the single pulse-width modulated signal.

3. The driver circuit of claim 1, wherein the first fast pull-up logic circuitry is configured to pull up the first gate voltage at a faster rate than the first pull-up pre-driver control circuit.

4. The driver circuit of claim 1, wherein the logic block further comprises:
   a first fast pull-down logic circuitry configured to pull down the first gate voltage from the high supply voltage to a second intermediate voltage between the low supply voltage and the high supply voltage; and
   a first pull-down pre-driver control circuit configured to pull down the first gate voltage from the second intermediate voltage to the low supply voltage.

5. The driver circuit of claim 4, wherein the logic block further comprises:
   a second fast pull-up logic circuitry configured to pull up the second gate voltage from the low supply voltage to a third intermediate voltage between the low supply voltage and the high supply voltage; and
   a second pull-up pre-driver control circuit configured to pull up the second gate voltage from the third intermediate voltage to the high supply voltage,
   wherein the second fast pull-up logic circuitry pulls up the second gate voltage at a faster rate than the second pull-up pre-driver control circuit.

6. The driver circuit of claim 5, wherein the logic block further comprises:
   a second fast pull-down logic circuitry configured to pull down the second gate voltage from the high supply voltage to a fourth intermediate voltage between the low supply voltage and the high supply voltage; and
   a second pull-down pre-driver control circuit configured to pull down the second gate voltage from the fourth intermediate voltage to the low supply voltage,
   wherein the second fast pull-down logic circuitry pulls down the second gate voltage at a faster rate than the second pull-down pre-driver control circuit.

7. The driver circuit of claim 4, wherein the first fast pull-down logic circuitry is configured to pull down the first gate voltage at a faster rate than the first pull-down pre-driver control circuit.

8. The driver circuit of claim 1, wherein the driver circuit is configured to drive a motor using the output signal Vout.

9. The driver circuit of claim 8, wherein the motor comprises a spindle motor in a hard disk drive.

10. The driver circuit of claim 9, wherein the hard disk drive is implemented within one of a vehicle, a cellular phone, a set top box, a media player, or a Voice over Internet Protocol (VoIP) player.

11. The driver circuit of claim 8, wherein the motor comprises a spindle motor in a digital versatile disc (DVD) drive.

12. The driver circuit of claim 1, further comprising:
   a first circuit for driving and holding the gate voltage on the gate of the first transistor to the high supply voltage or the low supply voltage; and
   a second circuit for driving and holding the gate voltage on the gate of the second transistor to the high supply voltage or the low supply voltage.

13. A method for generating an output signal Vout having a controlled slew rate, the output signal Vout being generated at an output node of a driver circuit, the driver circuit comprising a first transistor having (i) a first node coupled to a high supply voltage and (ii) a second node coupled to the output node of the driver circuit, the driver circuit further comprising (i) a second transistor having a first node coupled to a low supply voltage and (ii) a second node coupled to the output node of the driver circuit, the method comprising:

passing the high supply voltage from the first transistor to the output node based on a first gate voltage on a gate of the first transistor;

passing the low voltage supply from the second transistor to the output node based on a second gate voltage on a gate of the second transistor; and controlling the slew rate of the output signal Vout, wherein controlling the slew rate of the output signal Vout comprises (i) controlling a slew rate of the first gate voltage on the gate of the first transistor and (ii) controlling a slew rate of the second gate voltage on the gate of the second transistor;

wherein controlling the slew rate of the first gate voltage comprises pulling up the first gate voltage from the low supply voltage to a first intermediate voltage between the low supply voltage and the high supply voltage, and pulling up the first gate voltage from the first intermediate voltage to the high supply voltage.

14. The method of claim 13, wherein the driver circuit is configured to drive a motor using the output signal Vout.

15. The method of claim 14, wherein the motor comprises a spindle motor in a hard disk drive.

16. The method of claim 13, further comprising:

coupling the driver circuit to a first circuit for driving and holding the gate voltage on the gate of the first transistor to the high supply voltage or the low supply voltage; and coupling the driver circuit to a second circuit for driving and holding the gate voltage on the gate of the second transistor to the high supply voltage or the low supply voltage.

17. The method of claim 13, wherein controlling the slew rate of the first gate voltage further comprises:

pulling down the first gate voltage from the high supply voltage to a second intermediate voltage between the low supply voltage and the high supply voltage; and pulling down the first gate voltage from the second intermediate voltage to the low supply voltage.

18. The method of claim 13, wherein the rate of pulling up the first gate voltage from the low supply voltage to the first intermediate voltage is faster than the rate of pulling up the first gate voltage from the first intermediate voltage to the high supply voltage.

19. The method of claim 13, wherein controlling the slew rate of the second gate voltage comprises:

pulling up the second gate voltage from the low supply voltage to a third intermediate voltage between the low supply voltage and the high supply voltage; and pulling up the second gate voltage from the third intermediate voltage to the high supply voltage.

20. The method of claim 19, wherein controlling the slew rate of the second gate voltage further comprises:

pulling down the second gate voltage from the high supply voltage to a fourth intermediate voltage between the low supply voltage and the high supply voltage; and pulling down the second gate voltage from the fourth intermediate voltage to the low supply voltage.

* * * * *